United States Patent
Yi et al.

(10) Patent No.: US 9,520,187 B2
(45) Date of Patent: *Dec. 13, 2016

(54) ELECTRIC DEVICE HAVING WIRE CONTACTS COUPLED TO STACK STRUCTURES WITH VARIABLE RESISTANCE ELEMENTS

(71) Applicant: SK hynix Inc., Icheon-Si (KR)

(72) Inventors: Jae-Yun Yi, Icheon-Si (KR); Sung-Woong Chung, Icheon-Si (KR); Seok-Pyo Song, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,894

(22) Filed: Sep. 28, 2015

(65) Prior Publication Data

US 2016/0019956 A1 Jan. 21, 2016

Related U.S. Application Data

(63) Continuation of application No. 14/221,281, filed on Mar. 21, 2014, now Pat. No. 9,147,442.

(30) Foreign Application Priority Data

Mar. 28, 2013 (KR) .................. 10-2013-0033565

(51) Int. Cl.
*G11C 5/06* (2006.01)
*G11C 13/00* (2006.01)
(Continued)

(52) U.S. Cl.
CPC ....... *G11C 13/0026* (2013.01); *G06F 13/1673* (2013.01); *G06F 13/28* (2013.01);
(Continued)

(58) Field of Classification Search
CPC ............ H01L 27/0207; H01L 21/8221; G11C 2213/79; G11C 5/025; G11C 5/06; G11C 2213/71
(Continued)

(56) References Cited

U.S. PATENT DOCUMENTS 8,233,309 B2 7/2012 Fasoli
8,908,410 B2 * 12/2014 Ichige .................... G11O 5/025
365/148
9,147,442 B2 * 9/2015 Yi ...................... G11C 13/0028

FOREIGN PATENT DOCUMENTS

KR  10-2001-0004204 A  1/2001
KR  10-2010-0135181 A  12/2010

* cited by examiner

*Primary Examiner* — David Lam
(74) *Attorney, Agent, or Firm* — Perkins Coie LLP

(57) ABSTRACT

This patent document relates to memory circuits or devices and their applications in electronic devices or systems. The disclosed technology in this patent document includes memory circuits or devices and their applications in electronic devices or systems and various implementations of an electronic device in which an electronic device capable of reducing an area, improving device characteristics due to a reduction in the resistance of a switching transistor, simplifying the process, and reducing a cost is provided. In accordance with the electronic device of this patent document, an area can be reduced, device characteristics can be improved due to a reduction in the resistance of the switching transistor, the process can be simplified, and a cost can be reduced.

20 Claims, 27 Drawing Sheets

(51) Int. Cl.
　　　*G11C 5/02*　　　　(2006.01)
　　　*H01L 27/24*　　　(2006.01)
　　　*H01L 45/00*　　　(2006.01)
　　　*H01L 27/22*　　　(2006.01)
　　　*G06F 13/16*　　　(2006.01)
　　　*G06F 13/28*　　　(2006.01)
　　　*G06F 13/40*　　　(2006.01)
　　　*H01L 27/02*　　　(2006.01)

(52) U.S. Cl.
　　　CPC .......... *G06F 13/4022* (2013.01); *G11C 5/025* (2013.01); *G11C 5/06* (2013.01); *G11C 5/063* (2013.01); *G11C 13/0028* (2013.01); *H01L 27/228* (2013.01); *H01L 27/2436* (2013.01); *H01L 27/2463* (2013.01); *H01L 45/04* (2013.01); *H01L 45/06* (2013.01); *H01L 45/141* (2013.01); *H01L 45/146* (2013.01); *H01L 45/147* (2013.01); *H01L 27/0207* (2013.01)

(58) Field of Classification Search
　　　USPC ..................................... 365/72, 148, 158, 51
　　　See application file for complete search history.

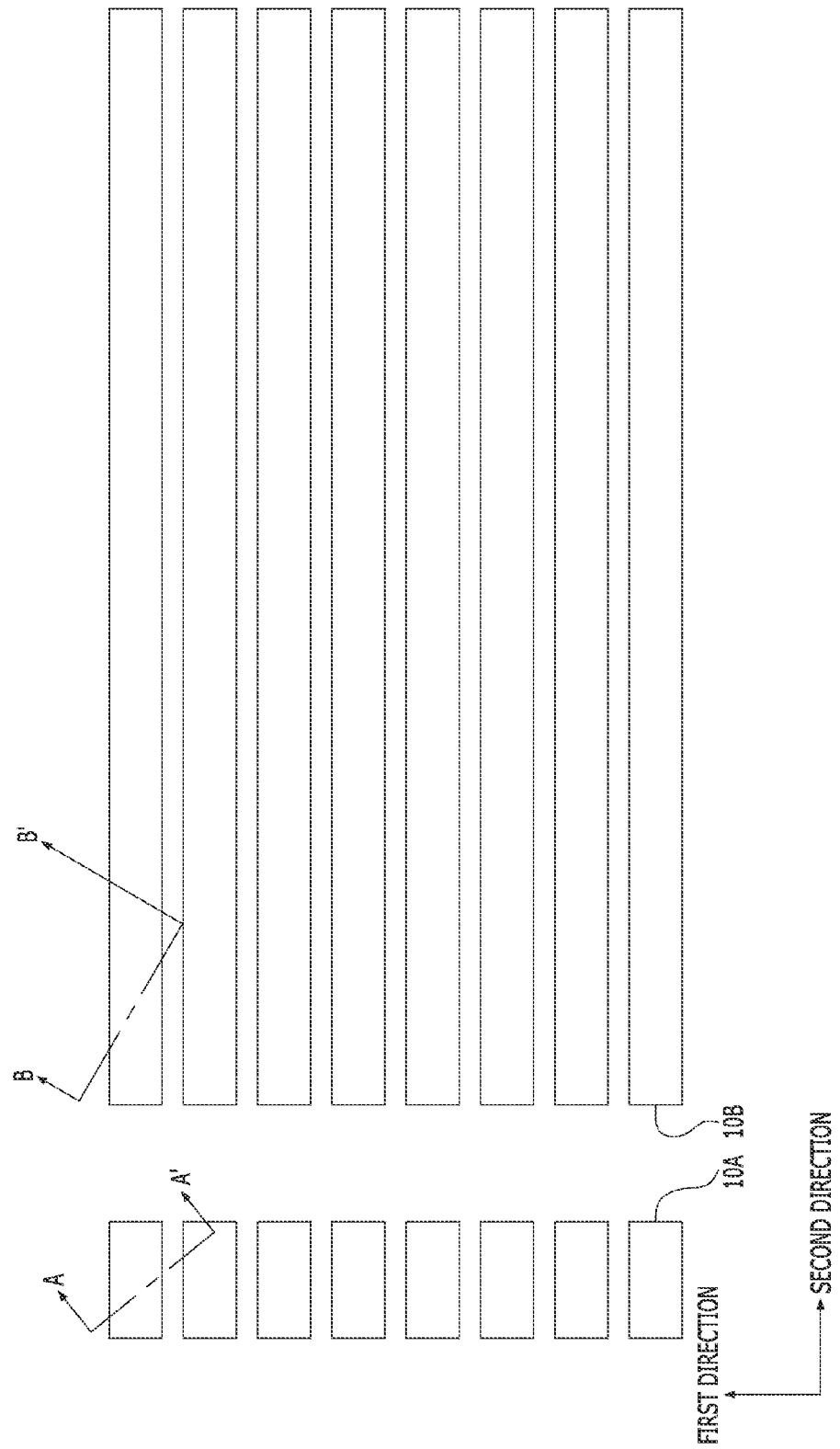

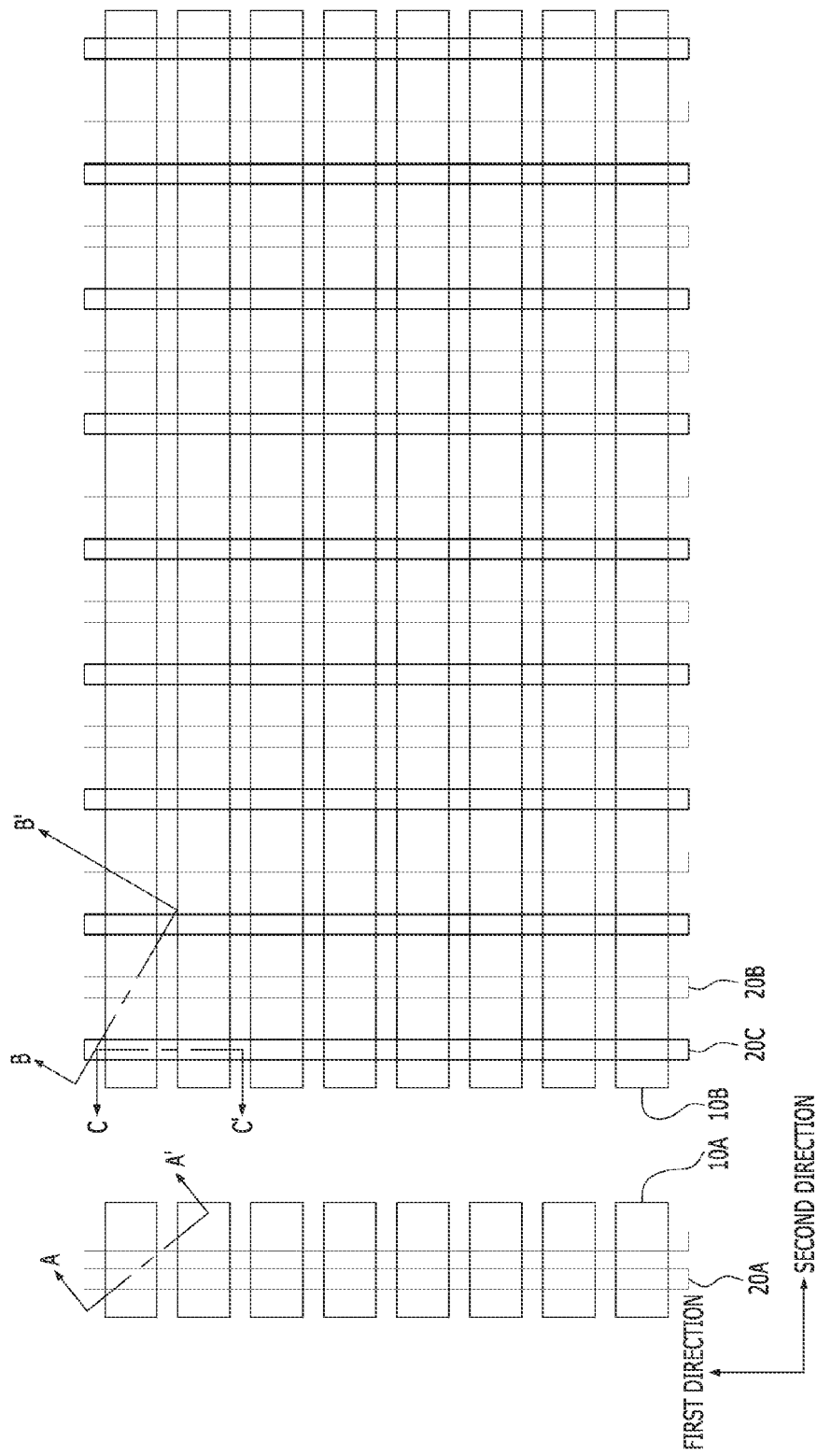

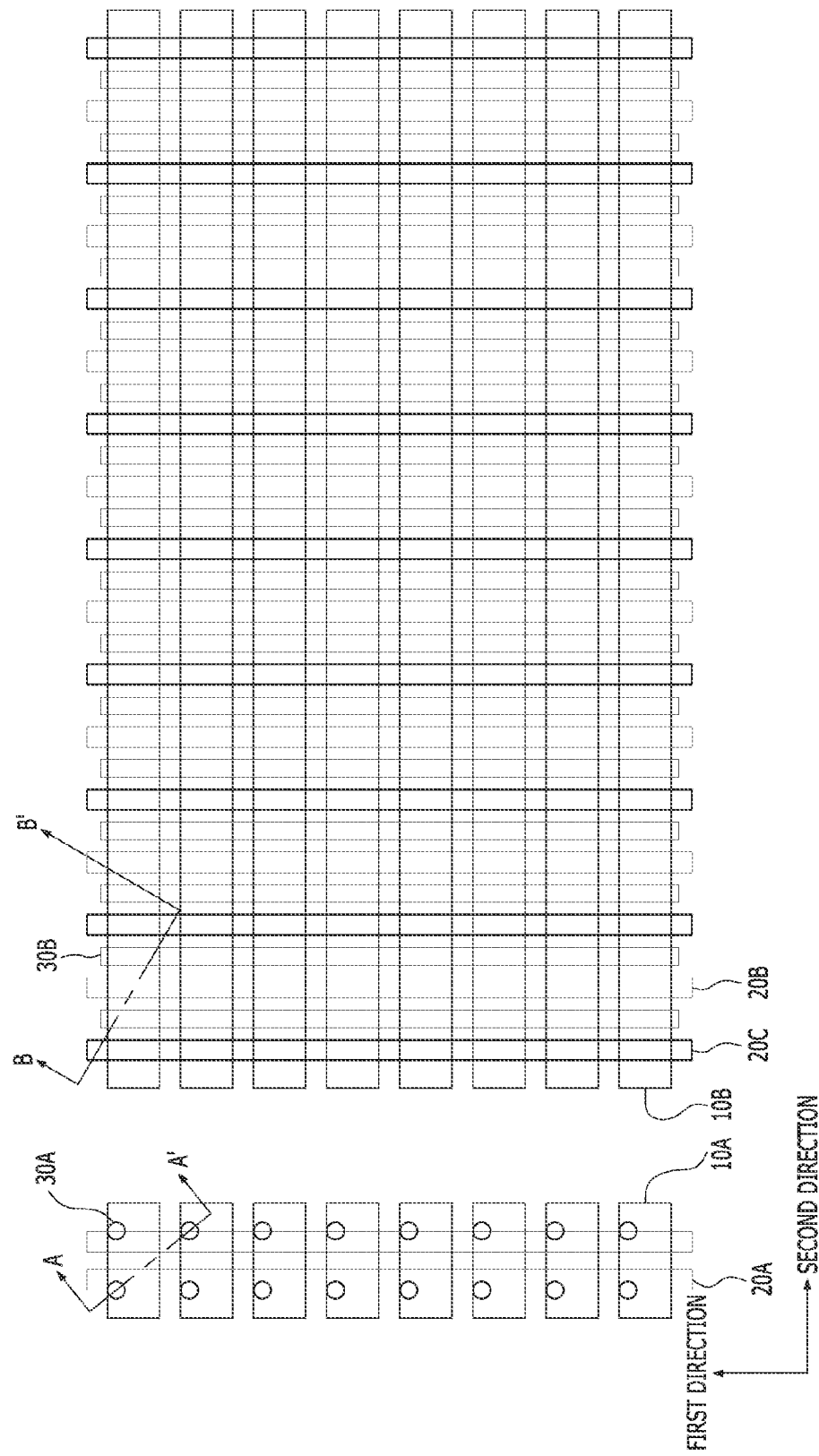

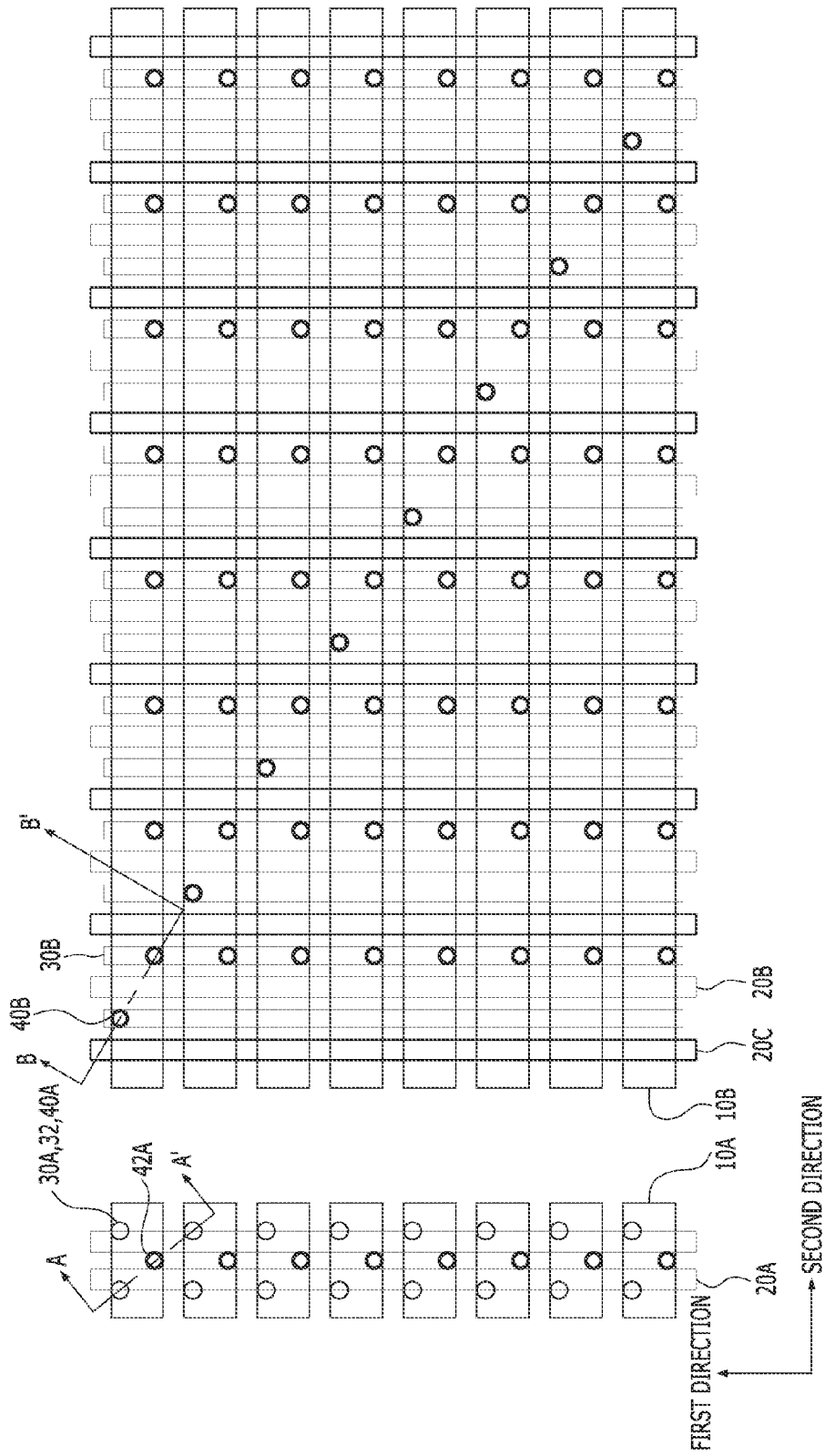

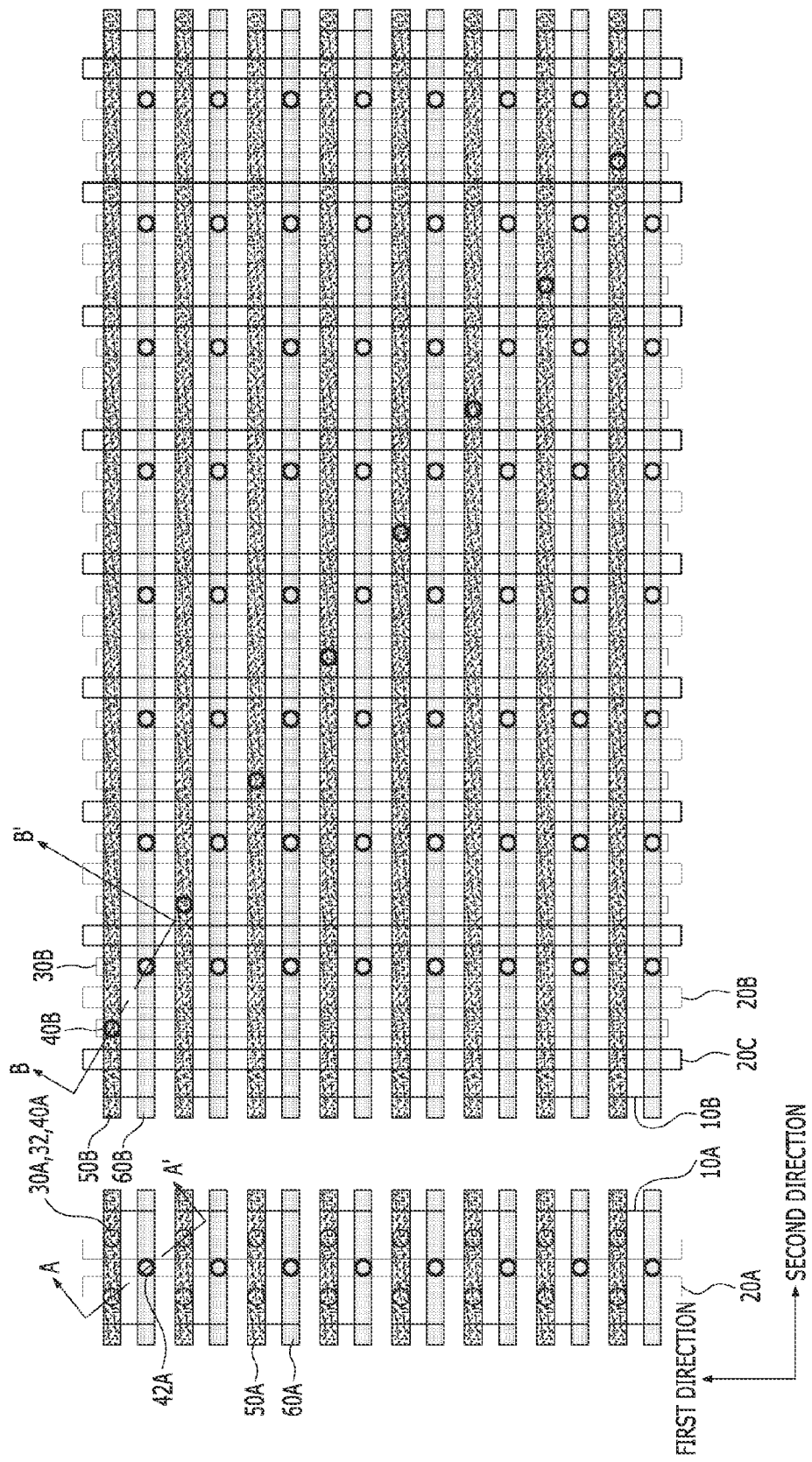

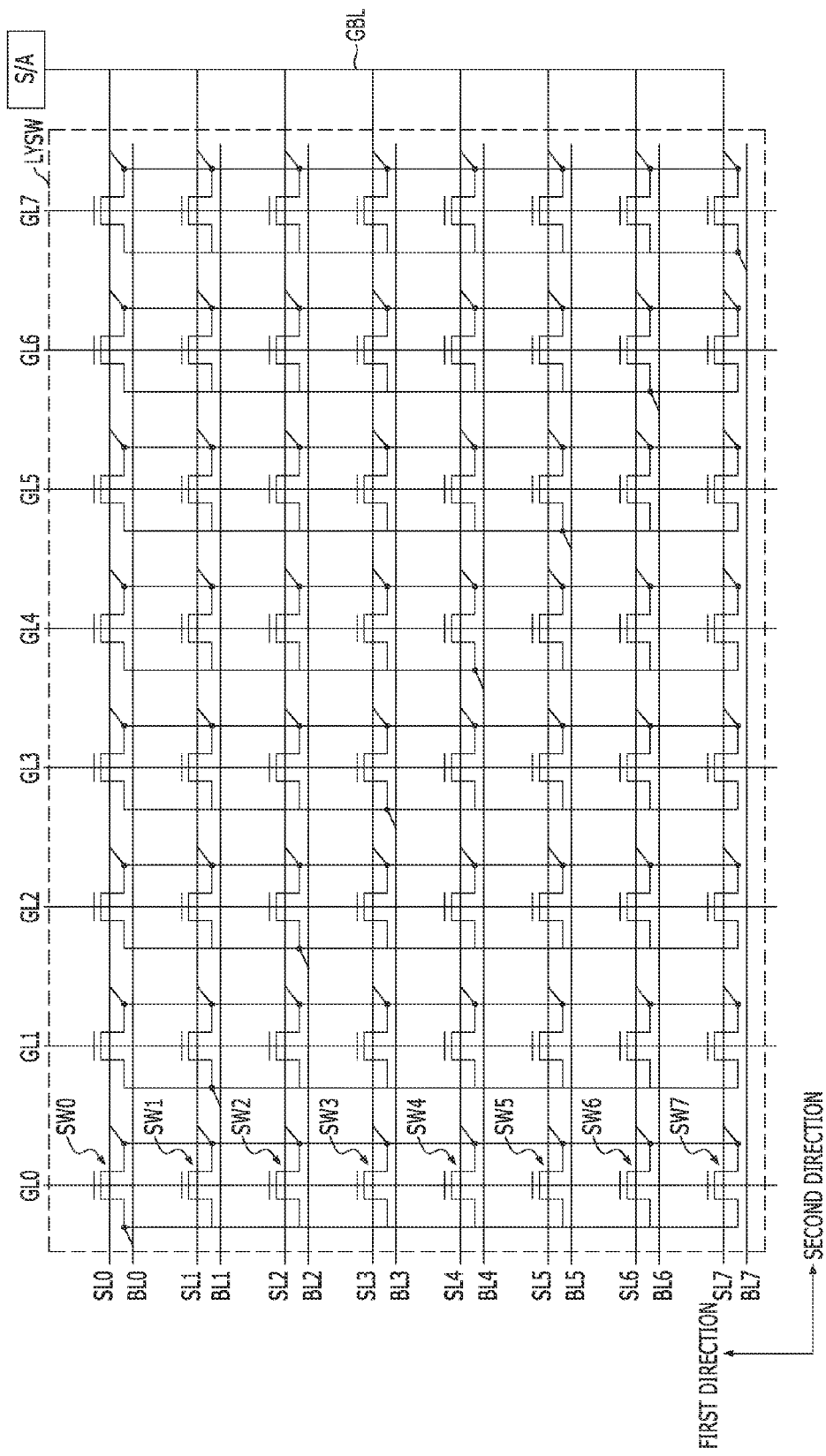

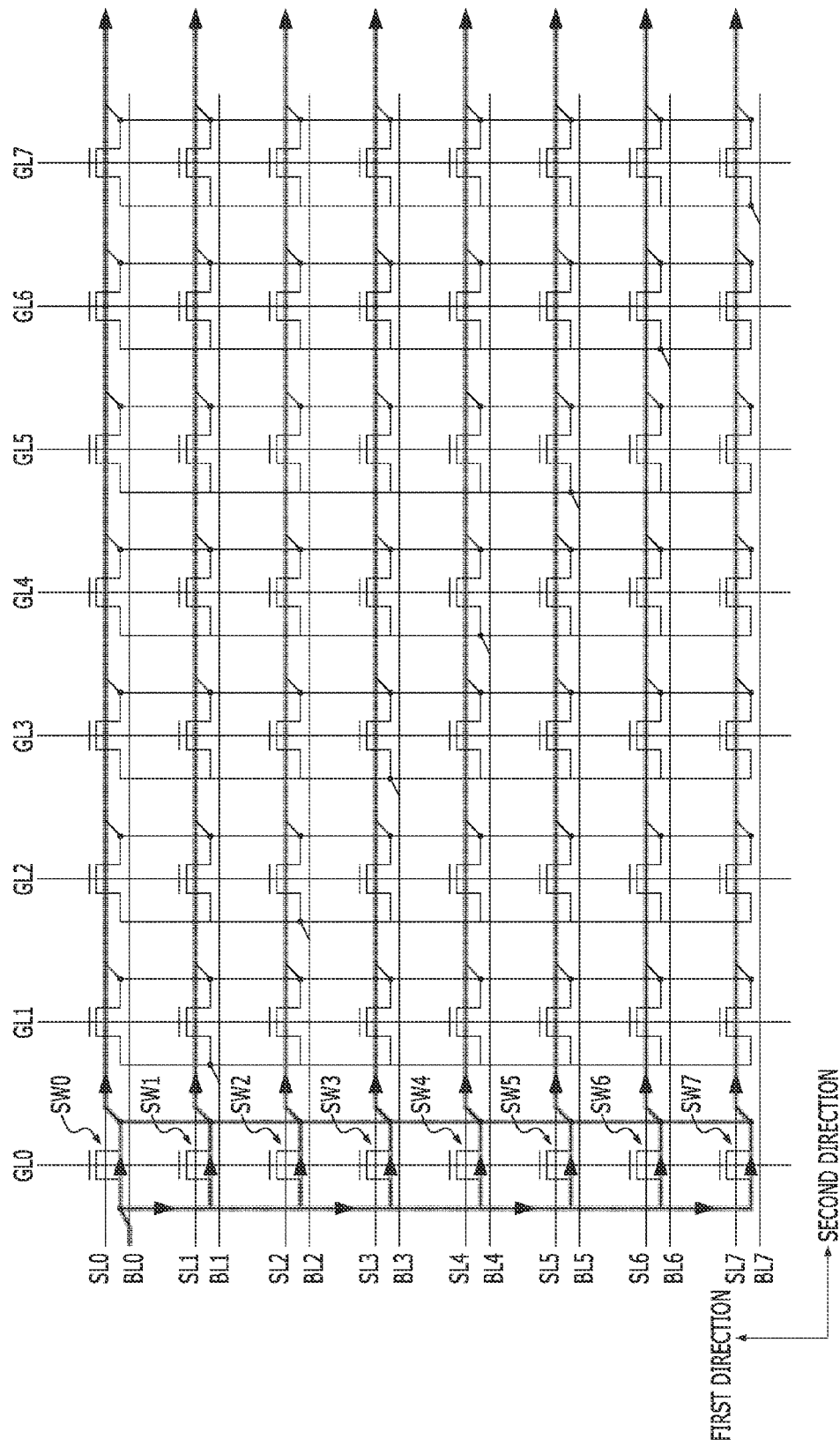

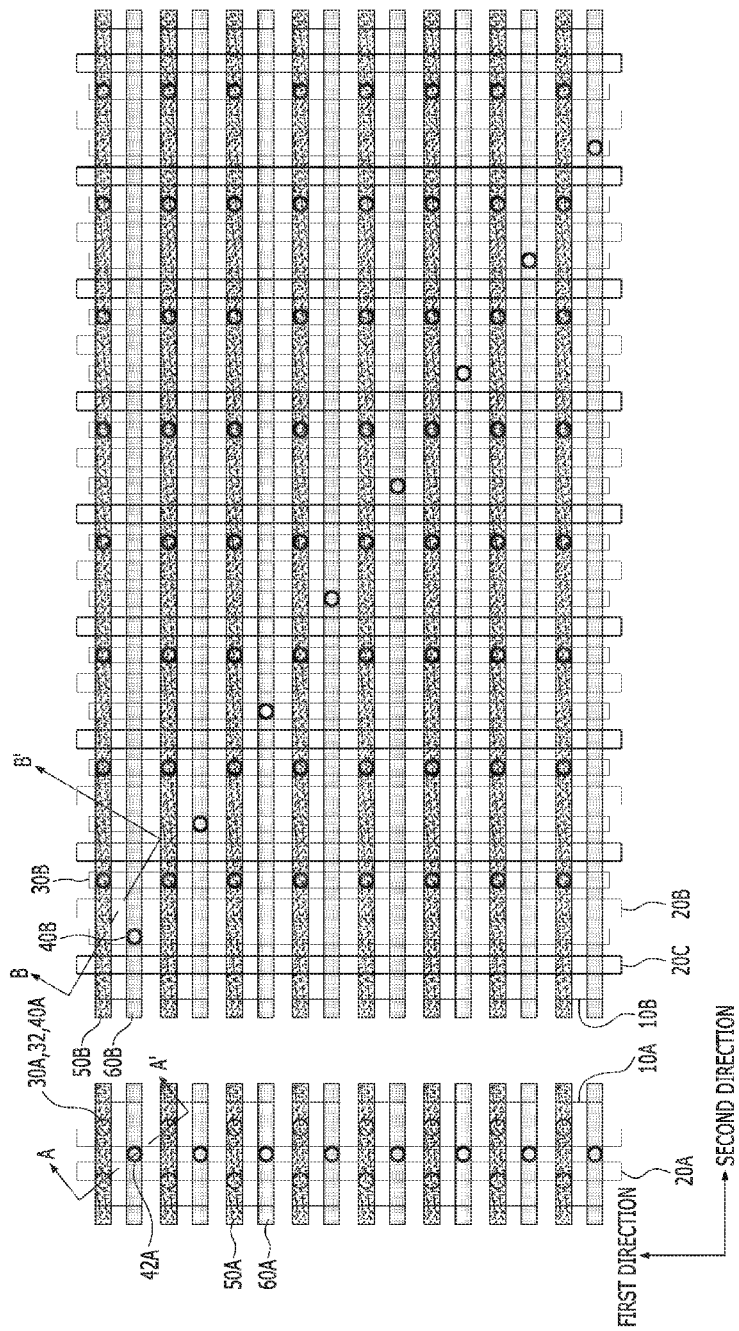

ELECTRIC DEVICE HAVING WIRE CONTACTS COUPLED TO STACK STRUCTURES WITH VARIABLE RESISTANCE ELEMENTS

CROSS-REFERENCE TO RELATED APPLICATIONS

The present application is a continuation of, and claims priority and benefits of, U.S. patent application Ser. No. 14/221,281, published as US 2014/0293672, entitled "ELECTRONIC DEVICE," and filed on Mar. 21, 2014, now U.S. Pat. No. 9,147,442, which further claims priority of Korean Patent Application No. 10-2013-0033565, entitled "SEMICONDUCTOR DEVICE, AND MICRO PROCESSOR, PROCESSOR, SYSTEM, DATA STORAGE SYSTEM AND MEMORY SYSTEM INCLUDING THE SEMICONDUCTOR DEVICE," and filed on Mar. 28, 2013. The contents of the before-mentioned patent applications (including US 2014/0293672) are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor and related electronic devices have been conducted for the semiconductor devices. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which an electronic device capable of reducing an area, improving device characteristics due to a reduction in the resistance of a switching transistor, simplifying the process, and reducing a cost is provided.

In one aspect, an electronic device is provided to include a semiconductor memory that includes: a mat region configured to include a plurality of memory cells coupled with first wires; and a switching region configured to control coupling between the first wires and an external region, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; N third wires coupled with the second upper contacts on the second side of each second gate and an external region and extended in the second direction.

In some implementations, the second gate is buried in the substrate.

In some implementations, a surface of an isolation layer placed between the second active regions is located under a surface of the second active region. In some implementations, a surface of an isolation layer overlapping with the second gate is located under a surface of the second active region overlapping with the second gate.

In some implementations, the electronic device further comprises a third gate extended in the first direction across the second active regions and buried in the substrate.

In some implementations, the third gate and one of the second gates are alternately disposed.

In some implementations, the third gate and a set of two second gates are alternately disposed, and the second upper contact on the second side of the second gate is placed between the two second gates, and the second upper contacts on the first side of the second gate are placed on both sides outside the set of two of the second gates.

In some implementations, the second lower contact has an elongated shape in the first direction to come in contact with every active regions in the first direction.

In some implementations, the second lower contact covers a space between two adjacent second active regions arranged in the first direction so that the two adjacent second active regions are coupled to each other.

In some implementations, the second upper contact on the first side of the second gate is placed close to a first side of the second active region in the first direction, and the second upper contact on the second side of the second gate placed close to a second side of the second active region in the first direction.

In some implementations, the second wire and the third wire are placed at the same height, and the second and third wires are disposed close to the first side and the second side of the second active region, respectively, in the first direction. In some implementations, the third wire is disposed close to the second side of the second active region in the first direction.

In some implementations, the mat region includes: N first active regions formed in the substrate, extended in the second direction, and arranged in the first direction; a first gate extended in the first direction across the N first active regions and extended in the first direction; stack structures respectively disposed over the N first active regions on a first side of the first gate, each stack structure including a first lower contact, a variable resistance element, and a first upper contact; and wire contacts disposed over every N first active regions on a second side of the first gate; and fourth wires, wherein the first wires are coupled with one of the stack structures and the wire contacts and extended in the second direction, and the fourth wires coupled with the other of the stack structures and the wire contacts and extended in the second direction.

In some implementations, the first and the second active regions, the first and the second gates, the first and the second lower contacts, the first to the third upper contacts, and the first to the fourth wires are placed at the same height.

In some implementations, the mat region and the switching region share a well formed in the substrate.

In some implementations, the switching region is disposed on at least one side of the mat region in the second direction, and the electronic device further comprises: a first driver disposed on at least one side of the mat region in the first direction, and coupled with the first gate to control the first gate; and a second driver placed in a region defined by the switching region and the first driver, and coupled with the second gate to control the second gate.

In some implementations, assuming that N first wires are included a wire group, the mat region comprises first to $T^{th}$ (T is a natural number equal to or greater than 2) wire groups, the switching region comprises first to $T^{th}$ switching regions configured to correspond to the respective first to the $T^{th}$ wire groups and arranged in the first direction, and the second gate crosses (N*T) second active regions included in the first to the $T^{th}$ switching regions.

In some implementations, the first wires in the mat region are divided into a number of groups, the switching region is divided into the same number of groups that correspond to the number of groups of the mat region.

In some implementations, the number of groups of the mat region are coupled with different external regions through the respective groups of the switching regions.

In some implementations, the second upper contacts on the first and second sides of the second gate are located in the same second active region, the second upper contact on the first side and the second upper contact on the second side are positioned as far apart as possible from each other in the first direction.

In another aspect, an electronic device is provided to include a semiconductor memory that includes: a mat region configured to comprise a plurality of memory cells and first wires coupled with the plurality of memory cells; and a switching region configured to control coupling between the each of the first wires and an external region, wherein the switching region comprises: second wires coupled with the respective first wires and extended in a second direction; third wires configured to correspond to the respective second wires, extended in the second direction, and coupled with the external region; second gate lines configured to correspond to the respective first wires and extended in a first direction crossing the second direction; and switching transistors configured to have gates coupled with each of the second gate lines and arranged in the first direction, wherein first nodes of the switching transistors are coupled together and coupled with a corresponding second wire of the second wires, and second nodes of the switching transistors are coupled with all the N third wires.

In some implementations, each of the plurality of memory cells comprises a variable resistance element and a selection transistor, and the mat region includes the first wire extended in the first direction and coupled with a first end of the memory cell, a fourth wire extended in the first direction and coupled with a second end of the memory cell, and a first gate line coupled with a gate of the selection transistor and extended in the first direction.

In some implementations, the switching region is disposed on at least one side of the mat region in the second direction, and the electronic device further comprises: a first driver disposed on at least one side of the mat region in the first direction, coupled with the first gate line, and configured to control the first gate line; and a second driver placed in a region defined by the switching region and the first driver, coupled with the second gate line, and configured to control the second gate line.

In some implementations, the first wires are included in a wire group, the mat region includes wire groups, the switching region includes switching regions configured to correspond to the respective wire groups and arranged in the first direction, and the second gate line is shared in the switching regions.

In some implementations, the number of wire groups of the mat region are coupled with different external regions through the respective switching regions.

In some implementations, a number of the first wires, a number of the second active regions, a number of the second gates, a number of the second wires and a number of the third wires are same.

In another aspect, an electronic device is provided to include a semiconductor memory that includes: a mat region configured to include gate lines, source lines, and bit lines that are connected to three terminals of selection transistors; and a switching region configured to include gate lines, source lines, and bit lines that are connected to three terminals of switching transistors, wherein the switching transistors arranged in parallel are connected with a common gate line, and, upon applying voltage to the common gate line to turn on the switching transistors arranged in parallel, data inputted from a corresponding bit line of the mat region is transferred to output nodes through the switching transistors arranged in parallel.

In some implementations, the mat region includes variable resistance elements coupled to selection transistors.

In some implementations, the device further includes a first driver disposed on at least one side of the mat region in the first direction; and a second driver placed in a region defined by the switching region and the first driver.

In some implementations, the bit lines in the mat region are divided into a number of groups, the switching region is divided into the same number of groups that correspond to the number of groups of the mat region.

In some implementations, the number of groups of the mat region are coupled with different external regions through the respective groups of the switching region.

In some implementations, the electronic devices may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic devices may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic devices may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic devices may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic devices may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In yet another aspect, a method for fabricating an electronic device is provided. The method includes: providing a substrate having a well region in which a mat region for a unit cell including a selection transistor and a variable resistance element and a switching region for a switching transistor are formed; forming a first active region defined by first isolation layers in the mat region and a second active region defined by second isolation layers in the switching region; forming a first gate in the mat region that is coupled with a gate of the selection transistor and a second gate and a third gate in the switching region, wherein the second gate is coupled with a gate of the switching transistor; and forming a first bit line and a first source line in the mat region that are respectively coupled with both terminals of the unit cell and a second bit line and a second source line in the switching region that are respectively coupled with two terminals of the switching transistor.

In some implementations, the method further includes: forming a first lower contact in the mat region to be connected with the first active region on one side of the first gate and a second lower contact in the switching region to be connected with the second active region on both sides of the second gate; forming a variable resistance element to be coupled with the first lower contacts; and forming a first upper contact and a source line contact in the mat region and a second upper contact in the switching region; wherein the first bit line and the first source line are respectively coupled with the first upper contact and the source line contact and the second bit line and the second source line are respectively coupled with the second upper contacts and the second source contacts.

In some implementations, the forming of the first gate in the mat region and the second gate and the third gate in the switching region comprising: etching the first and the second isolation layers to have greater depths than the first and the second active regions.

These and other aspects, implementations and associated advantages are described in greater detail in the drawings, the description and the claims.

BRIEF DESCRIPTION OF THE DRAWINGS

FIGS. 3A to 7B are diagrams illustrating a method of fabricating a semiconductor device including a mat region and a switching region in accordance with implementations of the disclosed technology in this document.

FIG. 9A is a diagram including the equivalent circuit of a switching region of FIG. 7A, and FIG. 9B is a diagram showing a data flow in FIG. 9A.

FIG. 13A is a plan view showing the switching region in accordance with yet another implementation of the disclosed technology in this document.

DETAILED DESCRIPTION

Figure 1:
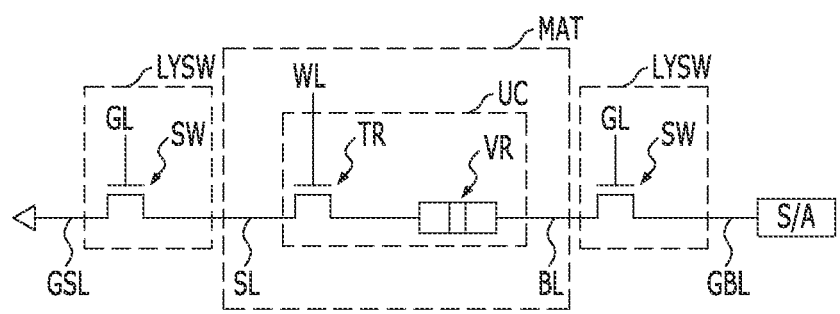
FIG. 1 is a schematic diagram showing a unit cell of a semiconductor device and elements coupled with the unit cell in accordance with an implementation of the disclosed technology in this document.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a schematic diagram showing a unit cell of a semiconductor device and elements coupled with the unit cell in accordance with an implementation of the disclosed technology in this document.

Referring to FIG. 1, the unit cell UC may include a variable resistance element VR configured of which resistance state can be switched between different resistance states in response to voltage or a current applied to the two ends of the variable resistance element VR and a selection transistor TR coupled with one end of the variable resistance element VR to select a desired one of a plurality of variable resistance elements VR.

The unit cell UC can store data using a resistance change characteristic of the variable resistance element VR. For example, when the variable resistance element VR is in a low resistance state, the unit cell UC may store data "0". When the variable resistance element VR is in a high resistance state, the unit cell UC may store data "1". The variable resistance element VR may be a single layer or a multiple layer that includes materials used in RRAM, PRAM, MRAM, and FRAM, for example, transition metal oxide, metal oxide, such as perovskite-based materials, phase change materials, such as chalcogenide-based materials, ferroelectric materials, or ferromagnetic materials. For example, if the variable resistance element VR is a magnetic resistance element used in MRAM, the variable resistance element VR may have a structure in which a tunnel barrier layer is interposed between two magnetic layers.

Two ends of the unit cell UC are coupled with a bit line BL and a source line SL, respectively. One end of the variable resistance element VR forms one end of the unit cell UC and is coupled with the bit line BL, and one end of the selection transistor TR forms the other end of the unit cell UC and is coupled with the source line SL. The gate of the selection transistor TR is coupled with a word line WL.

The source line SL may be coupled with a specific wire through a global source line GSL, and the bit line BL may be coupled with a sense amplifier S/A through a global bit line GBL to sense (S) and amplify (A) the data of the unit cell UC. In operation, the data of the variable resistance element VR is loaded onto the bit line BL and transferred to the sense amplifier S/A via a specific path. The sense amplifier S/A may be in the interface with an external region or inside the external region that receives the data from the unit cell UC. A switching transistor SW may be disposed between the source line SL and the global source line GSL for controlling coupling between the source line SL and the global source line GSL, and a switching transistor SW may be disposed between the bit line BL and the global bit line GBL for controlling coupling between the bit line BL and the global bit line GBL. The gate of the switching transistor SW may be coupled with a gate line GL.

A plurality of unit cells UC may be disposed in a mat region MAT, and the switching transistor SW may be disposed in a switching region LYSW located on sides of the mat region. More particularly, the plurality of unit cells UC disposed in the mat region MAT may form various forms of arrays. For example, a plurality of the bit lines BL, a plurality of the source lines SL, and a plurality of the word lines WL are arranged across the mat region MAT, and each of the plurality of unit cells UC may be controlled while being coupled with a corresponding bit line BL, a corresponding source line SL, and a corresponding word line WL. Furthermore, since the plurality of source lines SL and the plurality of bit lines BL are disposed in the mat region MAT, a plurality of the switching transistors SW may be disposed in the switching regions LYSW. For example, a plurality of switching transistors SW may be disposed in switching regions LYSW on the left of the mat region MAT to control coupling between source lines SL and global source lines GSL, and a plurality of switching transistors SW may be disposed in switching regions LYSW on the right of the mat region MAT to control coupling between bit lines BL and global source lines GSL. The disposition of the mat region MAT and the switching regions LYSW are to be illustrated with reference to FIG. 2 below.

Figure 2:
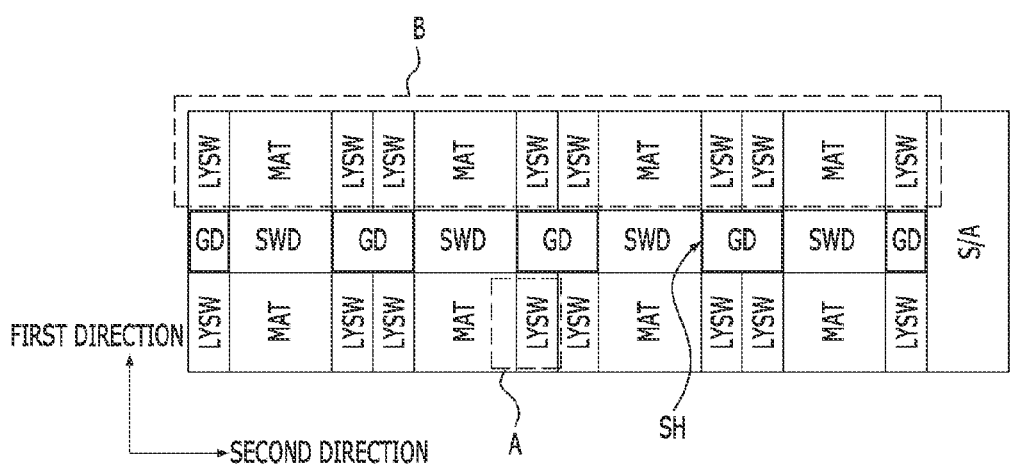
FIG. 2 is a diagram showing the disposition of the regions of a semiconductor device in accordance with an implementation of the disclosed technology in this document.

FIG. 2 is a diagram showing the disposition of regions of a semiconductor device in accordance with an implementation of the disclosed technology in this document.

Referring to FIG. 2, the semiconductor device may include a plurality of mat regions MAT. The mat regions MAT may be arranged in a matrix form in a first direction and a second direction. Eight mat regions MAT in form of an 2 by 4 array are illustrated as an example in FIG. 2, implementations having various different number of mat regions in arrays are also possible and the number and arrangement of the mat regions MAT may be changed in various ways.

A word line driver SWD for controlling a plurality of word lines WL may be disposed in one direction, for example, in the first direction. For example, as shown in FIG. 2, the word line driver SWD may be disposed between two mat regions MAT that are adjacent to each other in the first direction. In such a case, although not shown, a plurality of word lines WL disposed in each mat region MAT may be extended in the first direction and coupled with a corresponding word line driver SWD.

Furthermore, the aforementioned switching regions LYSW may be disposed in the other direction, for example, in the second direction. For example, the switching transistor SW for coupling the source line SL of each mat region MAT and the global source line GSL may be disposed in the switching region LYSW on one side of the mat region MAT in the second direction, and the switching transistor SW for coupling the bit line BL of the mat region MAT and the global bit line GBL may be disposed in the switching region LYSW on the other side of the mat region MAT in the second direction. Although not shown, a plurality of the source lines SL of respective mat regions MAT may be extended in the second direction and coupled with a switching region LYSW on one side, and a plurality of the bit lines BL may be extended in the second direction and coupled with a switching region LYSW on the other side.

Under the configuration that the mat region MAT, the switching region LYSW, and the word line driver SWD are arranged as described above, an empty space exists between the switching regions LYSW in the first direction and between the word line drivers SWD in the second direction. The empty space is referred to as a sub-hole region SH. A gate driver GD for controlling the gate line GL of a switching transistor SW in the switching region LYSW can be placed in the sub-hole region SH. Although not shown, the gate line GL of the switching transistor SW may be extended in the first direction and coupled with the gate driver GD.

Although not shown, the global bit line GBL may be coupled with the sense amplifier S/A across the mat region MAT and the switching region LYSW which are arranged in the second direction. Furthermore, although not shown, the global source line GSL may be coupled with a specific wire (not shown) across the mat region MAT and the switching region LYSW which are arranged in the second direction.

In the aforementioned semiconductor device, it is required to minimize resistance of the switching transistor SW. If the switching transistor SW has high resistance, there is a problem in that a sensing margin in the sense amplifier S/A is reduced or an operating voltage is increased. Furthermore, it is also desirable to reduce an area occupied by the switching transistor SW and make a process of forming the switching transistor SW easier. An example of a switching transistor SW satisfying the requirements will be illustrated with reference to FIGS. 3A to 12B below.

FIGS. 3A to 7B are diagrams illustrating the switching transistor of a semiconductor device and a method of fabricating the same in accordance with implementations of the disclosed technology in this document. FIGS. 3A to 7A show plan views, and FIGS. 3B to 7B are cross-sectional views of the switching transistors of line A-A' and line B-B' of FIGS. 3A to 7A. While FIGS. 3A to 7B are included to show a region A of FIG. 2, for ease of explanation, other areas are also indicated, including a switching region in which a switching transistor is disposed (refer to the right part of each plan view FIGS. 3A to 7A and the part B-B' of each cross-sectional view FIGS. 3B to 7B) and part of a mat region in which a plurality of unit cells is disposed (refer to the left part of each plan view of FIGS. 3A to 7A and the part A-A' of each cross-sectional view FIGS. 3B to 7B). Both the switching region and the mat region are described with reference to FIGS. 3A to 7B below.

First, a fabrication method is described below.

Figure 3B:
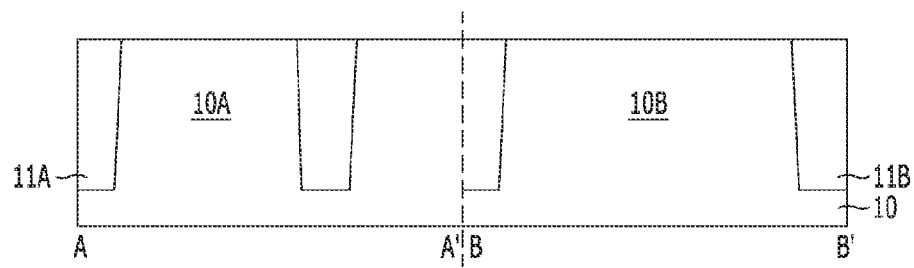

Referring to FIGS. 3A and 3B, a substrate 10 in which a specific underlying structure, for example, a well region (not shown) is formed is provided. A first active region 10A is defined by forming first isolation layers 11A in the substrate 10 of a mat region. A second active region 10B is defined by forming second isolation layers 11B in the substrate 10 of a switching region.

The first and the second isolation layers 11A and 11B may be formed using a method of forming isolation trenches by selectively etching regions of the substrate 10 where the first and the second isolation layers 11A and 11B will be formed and filling the isolation trenches with insulating materials, such as oxide.

The first active region 10A may have a line shape extending in a second direction, and a plurality of the first active regions 10A may be arranged in a first direction. The number of first active regions 10A may be the same as the number of first bit lines to be disposed in a mat region. As one example, although 8 first active regions 10A are illustrated in the present implementation, other implementations are possible such that the number of first active regions 10A may be changed in various ways. The number of first bit lines to be disposed in the mat region, that is, the number of first active regions 10A, is assumed to be N (N is a natural number equal to or greater than 1). The second active region 10B is disposed on one side of the first active region 10A and configured to have a line shape extending in the second direction. The second active regions 10B may be arranged in the same number as that of the first active region 10A. The first active regions 10A and the second active regions 10B may have a one-to-one correspondence.

Figure 4B:
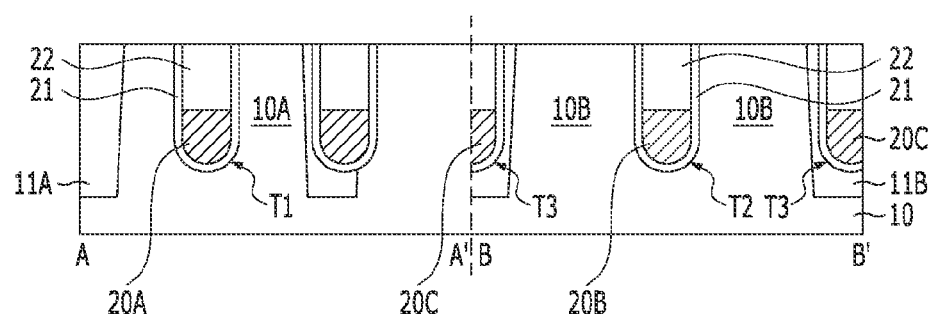

Referring to FIGS. 4A and 4B, a mask pattern (not shown) is formed over the resultant structure of FIGS. 3A and 3B. The mask pattern are used to exposed various regions which include a region in which the gate (hereinafter referred to as a 'first gate') of the selection transistor of the mat region will be formed, a region in which the gate (hereinafter referred to as a 'second gate') of the switching transistor of the switching region will be formed, and a region in which a gate (hereinafter referred to as a 'third gate') for separating switching transistors adjacent to each other in the second direction. Then, the first trench T1 of the mat region and the second and the third trenches T2 and T3 of the switching region are formed by etching the substrate 10, that is, the first and the second active regions 10A and 10B and the first and the second isolation layers 11A and 11B, to a specific depth using the mask pattern as an etch barrier. Each of the first to the third trenches T1, T2, and T3 may have a line shape extending in the first direction.

A gate insulating layer 21 is formed on the sidewall of each of the first to the third trenches T1, T2, and T3. The gate insulating layer 21 may be formed using, for example, a thermal oxidization process or an insulating layer deposition process.

First to third gates 20A, 20B, and 20C are formed to partially bury the respective first to the third trenches T1, T2, and T3 in which the gate insulating layers 21 have been formed.

The first to the third gates 20A, 20B, and 20C may be formed using a method of first forming conductive materials that cover the results in which the gate insulating layers 21 have been formed and then performing etch-back on the conductive materials until the conductive materials have a desired height. As a result of this process, the first to the third gates 20A, 20B, and 20C forme across the first and the second active regions 10A and 10B and extend in the first direction. As in the present implementation, the first to the third gates 20A, 20B, and 20C may be buried in the substrate 10, but other implementations are also possible. For example, in one implementation, the first to the third gates 20A, 20B, and 20C may be placed over the substrate 10, or in another implementation, parts of the first to the third gates 20A, 20B, and 20C may be buried in the substrate 10 and the remaining parts thereof may be protruded over the substrate 10.

As described above, the second gate 20B serves as the gate of the switching transistor. The number of second gates 20B may be determined based on the number of first bit lines to be disposed in the mat region. In the present implementation, n number of second gates 20B that is the same number as the first bit lines may be disposed in the mat region. Thus, eight second gates 20B are illustrated in FIG. 4A where eight first bit lines are shown. In such a case, the second gates 20B may have a one-to-one correspondence with the first bit lines of the mat region and can control data transmission, that is, whether or not to transfer data loaded by the respective first bit lines. However, other implementations are also possible such that the number of the second gates disposed in the mat region are not identical as the number of the first bit lines. For example, the number of second gates 20B may be decreased by $1/2^n$ (n is a natural number) of the number of first bit lines of the mat region depending on shapes of second lower contacts (refer to 30B of FIG. 5A) that will be explained later in more detail in connection with FIGS. 11A and 11B.

Figure 12A:
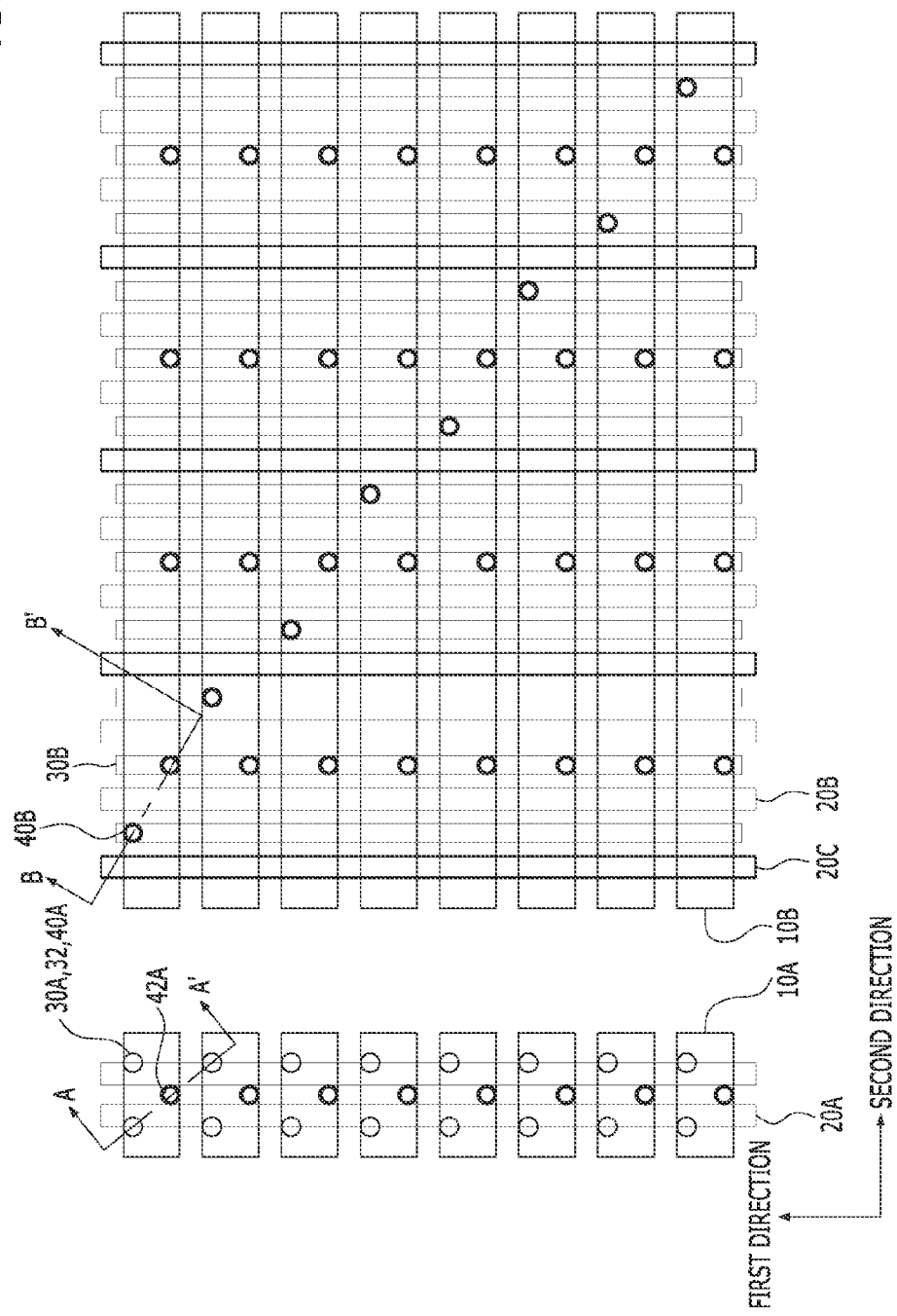
FIG. 12A is a plan view showing the switching region in accordance with yet another implementation of the disclosed technology in this document.
Figure 12B:
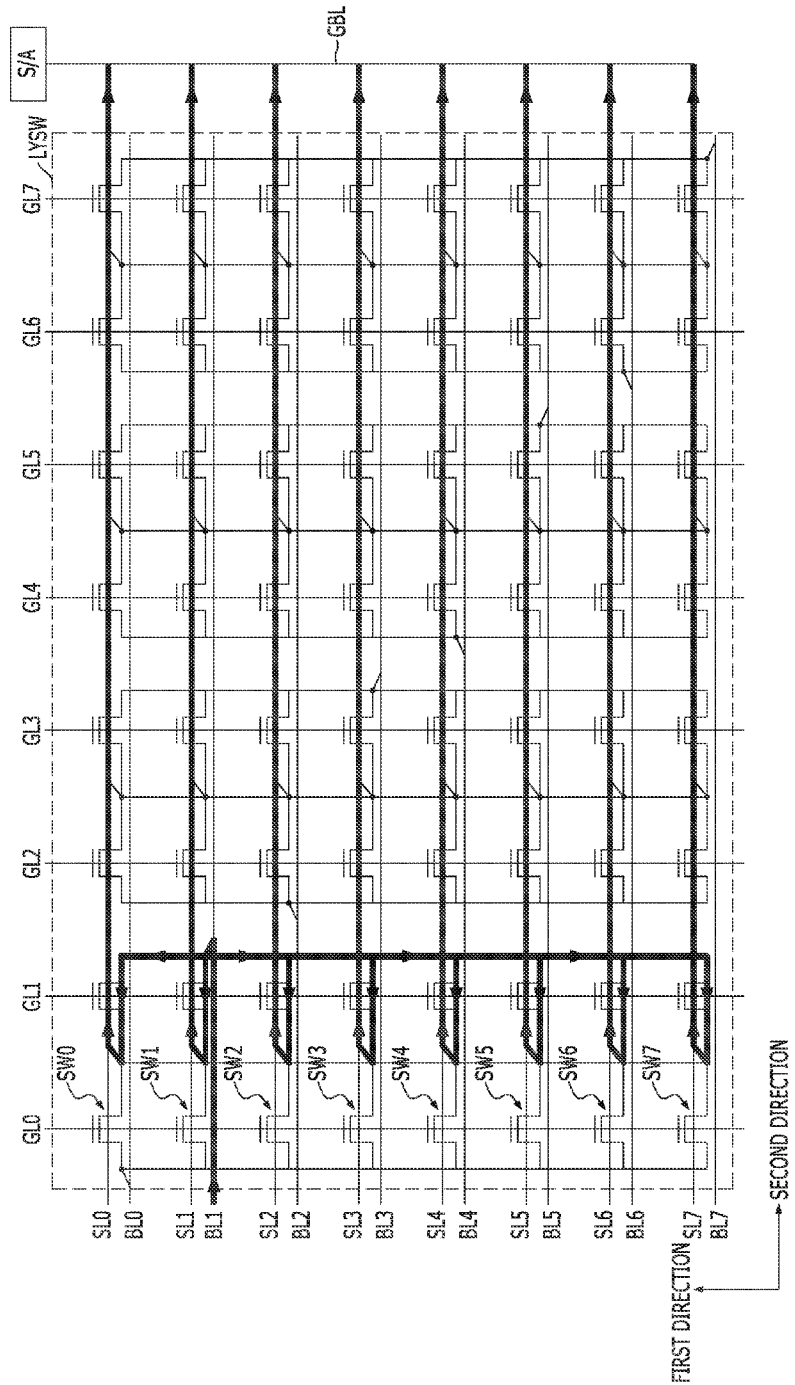
FIG. 12B is a diagram showing the equivalent circuit of a switching region of FIG. 12A.

Although the second gate 20B and the third gate 20C are alternately disposed in the present implementation, other implementations are also possible. For example, the third gate 20C may be omitted, or the third gate 20C may form a repeating configuration with a number of the second gates. As one example, FIGS. 12A and 12B show that a third gate 20C forms a repeating configuration with two second gates 20B, which will be described later in detail.

The number of first gates 20A is selected independently of the number of first bit lines of the mat region and may be changed in various ways. As described above, FIG. 2 which shows only part of the mat region shows the two first gates 20A but other implementations are also possible.

Next, gate passivation layers 22 that bury the remaining spaces of the first to the third trenches T1, T2, and T3 in which the first to the third gates 20A, 20B, and 20C have been formed are formed. The gate passivation layers 22 are placed over the first to the third gates 20A, 20B, and 20C, respectively, thus protecting the first to the third gates 20A, 20B, and 20C. The gate passivation layers 22 may be formed using a method of forming an insulating layer, etc. on the results in which the first to the third gates 20A, 20B, and 20C have been formed and then performing a polishing process, for example, chemical mechanical polishing (CMP) until the substrate 10 is exposed.

Although not shown, the junction of the selection transistor and the switching transistor may be formed by doping impurities into or performing a silicide process on the first and the second active regions 10A and 10B other than the gate passivation layers 22. For convenience of explanation, junctions on both sides of the first gate 20A are hereinafter referred to as a first source and a first drain, respectively. In the present implementation, two selection transistors adjacent to each other in the second direction can share the first source. Furthermore, for convenience of explanation, junctions on both sides of the second gate 20B are hereinafter referred to as a second source and a second drain, respectively. In the present implementation, the junctions on the right side and the left side of the second gate 20B are referred to as the second source and the second drain, respectively. Accordingly, a plurality of the selection transistors each configured to have a gate coupled with the first gate 20A including the first source and the first drain on both sides thereof may be formed in the mat region, and a plurality of the switching transistors each configured to have a gate coupled with the second gate 20B including the second source and the second drain on both sides thereof may be formed in the switching region. The switching transistors of the switching region are separated from each other by the third gate 20C in the second direction and are separated from each other by the second isolation layer 11B in the first direction.

Figure 8:
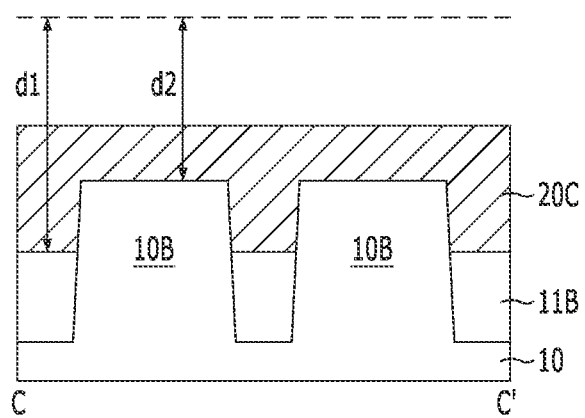
FIG. 8 is a cross-sectional view of the semiconductor device of line C-C' of FIG. 4A.

In the process of FIGS. 4A and 4B, the first and the second active regions 10A and 10B and the first and the second isolation layers 11A and 11B are etched for forming the first to the third trenches T1, T2, and T3. When performing the etching, the first and the second isolation layers 11A and 11B are etched to have greater depths than the first and the second active regions 10A and 10B. Thus, in the first to third trenches T1, T2, and T3, the first and the second active regions 10A and 10B protrude more than the first and the second isolation layers 11A and 11B. In such a case, the current driving abilities of the selection transistor and the switching transistor can be improved because the first to the third gates 20A, 20B, and 20C can surround the top surfaces and sides of the active regions 10A protruded in the first direction. This is schematically shown in FIG. 8. FIG. 8 is a cross-sectional view of the semiconductor device of line C-C' of FIG. 4A. Referring to FIG. 8, when performing etching for forming the third trench T3, the second isolation layer 11B may be etched up to a first depth d1 from a surface (see a dotted line) of the substrate, and the second active region 10B may be etched up to a second depth d2 from the surface of the substrate. Accordingly, the second isolation layer 11B is protruded higher than the second active region 10B within the third trench T3, and thus the third gate 20C is formed to surround the protruded part of the second active region 10B. Each of the first and second trenches T1 and T2 has the same shape as the third trench T3, and thus each of the first and second gates 20A and 20B has the same shape as the third gate 20C.

Figure 5B:
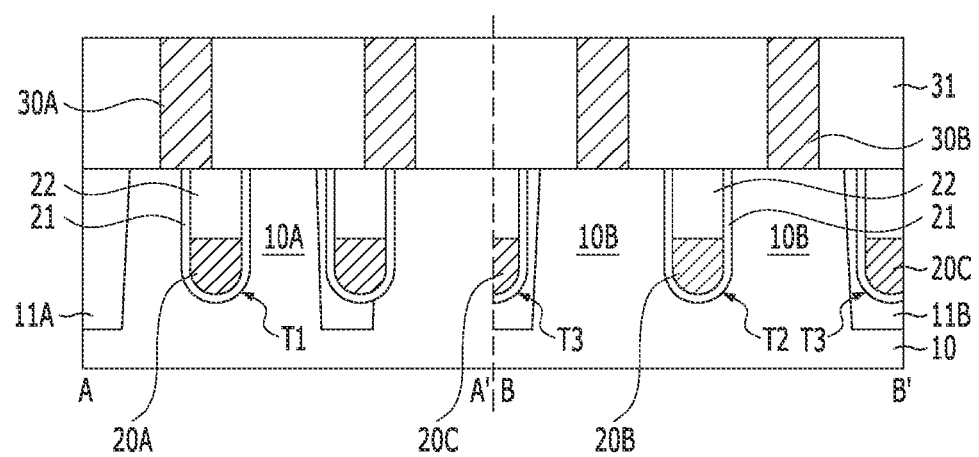

Next, referring to FIGS. 5A and 5B, a first interlayer insulating layer 31 is formed to cover the resultant structures of FIGS. 4A and 4B. The first interlayer insulating layer 31 may be, for example, an oxide layer.

First lower contacts 30A are formed such that each first lower contact penetrates the first interlayer insulating layer 31 of the mat region and is coupled with any one of the first active regions 10A on both sides of the first gate 20A. Second lower contacts 30B are formed such that each second lower contact penetrates the first interlayer insulating layer 31 of the switching region and is coupled with the second active region 10B of the second gate 20B.

More particularly, the first lower contact 30A is placed under a variable resistance element which is described later and configured to couple the variable resistance element and a junction on one side of the first gate 20A. Each first lower contact 30A may have an island shape, and the first lower contacts 30A may be disposed to be coupled with the first active regions 10A, respectively, on both sides other than a space between the two first gates 20A, that is, the first drains. Furthermore, the first lower contact 30A may be disposed close to one side, for example, the upper side, of the first active region 10A in the first direction. Thus, an interval between the first lower contact 30A and a source line contact to be described later can be secured, and if the first bit line and the first source line are formed in the same layer, an interval between the first bit line and the first source line of the mat region can be secured.

The second lower contacts 30B are disposed on both sides of the second gate 20B. Each of the second lower contacts 30B may have a long bar shape extending in the first direction and couple the plurality of second active regions 10B arranged in the first direction. That is, the second lower contacts 30B couple the plurality of second active regions 10B at the left and right sides of the second gate 20B. If switching transistors are arranged in the first direction, the second lower contact 30B enables their second drain nodes to be coupled from one another, and their second source nodes to be coupled from one another.

The first and second lower contacts 30A and 30B may be formed by forming a mask pattern (not shown) through which a region in which the first and second lower contacts 30A and 30B will be formed is exposed on the first interlayer insulating layer 31, etching the first interlayer insulating layer 31 until the first and the second active regions 10A and 10B are exposed using the mask pattern as an etch barrier, and filling the etched spaces with conductive materials, for example, metal or metal nitride.

Figure 6B:
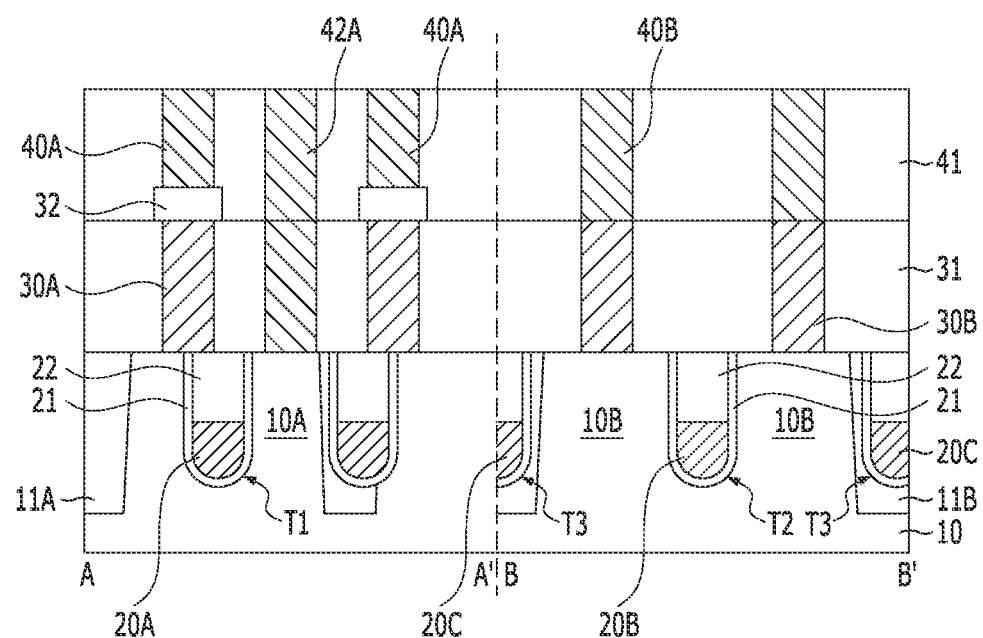

Referring to FIGS. 6A and 6B, variable resistance elements 32 coupled with the first lower contacts 30A, respectively, are formed on the resultant structures of FIGS. 5A and 5B. Each of the variable resistance elements 32 is interposed between the first lower contact 30A and a first upper contact 40A to be described later and is configured to switch between different resistance states in response to voltage or a current applied thereto through the first lower contact 30A and a first upper contact 40A.

The variable resistance elements 32 may be formed by forming a material layer for forming the variable resistance elements 32 on the resultant structures of FIGS. 5A and 5B and selectively etching the material layer. For example, if the variable resistance element 32 is used in MRAM, the variable resistance element 32 may be formed by sequentially forming a lower magnetic layer, a tunnel barrier layer, and an upper magnetic layer and selectively etching the lower magnetic layer, the tunnel barrier layer, and the upper magnetic layer. Since the variable resistance element 32 overlaps with the first lower contact 30A, the variable resistance element 32 is indicated as the same element as the first lower contact 30A in the plan view of FIG. 6A.

A second interlayer insulating layer 41 that covers the resultant structure in which the variable resistance elements 32 have been formed is formed. The second interlayer insulating layer 41 may be an oxide layer.

First upper contacts 40A are formed to penetrate the second interlayer insulating layer 41 of the mat region and coupled with the respective variable resistance elements 32. A source line contact 42A is formed to penetrate the second interlayer insulating layer 41 and the first interlayer insulating layer 31 of the mat region and coupled with the first active region 10A on the other side of the first gate 20A. A second upper contact 40B is formed to penetrate the second interlayer insulating layer 41 of the switching region and coupled with the second lower contact 30B.

More particularly, the first upper contact 40A is placed over the variable resistance element 32 and configured to couple the variable resistance element 32 and a first bit line which will be described later. Since the first upper contact 40A may overlap with the variable resistance element 32 and the first lower contact 30A, the first upper contact 40A is indicated as the same element as the variable resistance element 32 and the first lower contact 30A in the plan view of FIG. 6A.

The source line contact 42A couples a junction on the other side of the first gate 20A and a source line which will be described later. The source line contact 42A has an island shape, and may be disposed to be coupled with the first active region 10A, that is, the first source between the two first gates 20A. Furthermore, the source line contact 42A may be disposed so that it is placed on the lower side of the first active region 10A in the first direction. Thus, an interval between the source line contact 42A and the first lower contact 30A can be secured, and if the first bit line and the first source line are formed in the same layer, an interval between the first bit line and the first source line of the mat region can be secured.

The second upper contact 40B may be formed on one side, for example, the left of the second gate 20B and overlap with only a corresponding portion of the second active regions 10B arranged in the first direction. Here, the corresponding portion of the second active region 10B may be determined depending on the location of the second gate 20B. For example, as shown, a $t^{th}$ (t is any number between 1 and 8) second gate 20B from left may correspond to a $t^{th}$ second active region 10B from top. Accordingly, the second upper contact 40B on the left side of the $t^{th}$ second gate 20B may overlap with the $t^{th}$ second active region 10B from top. In contrast, the second upper contacts 40B on the other side, for example, the right side of the $t^{th}$ second gates 20B may overlap with the respective second active regions 10B arranged in the first direction. Furthermore, the second upper contact 40B on the left of the second gate 20B may be placed on the upper side, just like the first upper contact 40A, and the second upper contact 40B on the right of the second gate 20B may be placed on the lower side, just like the source line contact 42A. Thus, an interval between a second bit line and a second source line disposed in the switching region can be secured if the second bit line and the second source line are placed in the same layer.

The first upper contacts 40A, the source line contacts 42A, and the second upper contacts 40B may be formed by forming a mask pattern (not shown) through which regions in which the first upper contacts 40A, the source line contacts 42A, and the second upper contacts 40B will be formed are exposed on the second interlayer insulating layer 41, etching the second interlayer insulating layer 41 or the first interlayer insulating layer 31 or both until the variable resistance elements 32, the first active regions 10A, and the second lower contacts 30B are exposed using the mask pattern as an etch barrier, and filling the etched spaces with conductive materials, for example, metal or metal nitride.

Figure 7B:
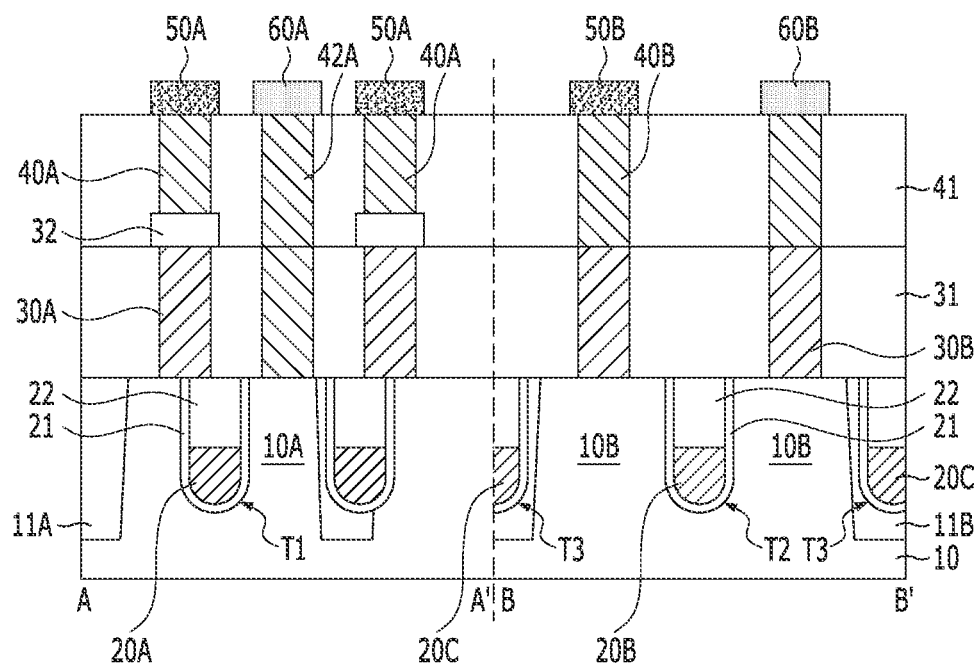

Referring to FIGS. 7A and 7B, further elements are formed on the resultant structures of FIGS. 6A and 6B. First bit lines 50A are formed to be coupled with the first upper contacts 40A and extended in the second direction, and first source lines 60A are formed to be coupled with the source line contacts 42A and extended in the second direction. Furthermore, second bit lines 50B are formed to be coupled with the second upper contacts 40B on the left side of the second gates 20B and extended in the second direction, and second source lines 60B are formed to be coupled with the second upper contacts 40B on the right side of the second gates 20B and extended in the second direction. Accordingly, a pair of the first bit line 50A and the first source line 60A may be disposed in each first active region 10A of the mat region, and a pair of the second bit line 50B and the second source line 60B may be disposed in each second active region 10B of the switching region.

The first bit lines 50A, the first source lines 60A, the second bit lines 50B, and the second source lines 60B may be formed by depositing conductive materials, such as metal or metal nitride, on the resultant structures of FIGS. 6A and 6B and patterning the conductive materials.

Although not shown, a first bit line 50A may be directly coupled or indirectly coupled through a specific conductive pattern with a corresponding second bit line 50B. When the first bit line 50A and the second bit line 50B are directly coupled, the bit lines are formed to cross the mat region and the switching region and be extending in the second direction. In this case, however, the first source line 60A and the second source line 60B are not coupled to each other.

The first bit line 50A of the mat region functions to transfer the data of the variable resistance element 32. The first source line 50B is coupled with one end of the selection transistor and configured to supply a specific bias to the selection transistor. The second bit line 50B and the second source line 60B of the switching region which correspond to the first bit line 50A and the first source line 60A of the mat region, respectively, are referred to as a bit line and a source line. The second bit line 50B and the second source line 60B of the switching region perform functions different from those that are performed by the bit line and the source line in the mat region, For example, the second bit line 50B of the switching region which is coupled with a corresponding first bit line 50A receives data from the first bit line 50A. With the control of the switching transistor, the second source line 50A transfers data transferred to any one of the second bit lines 50B, to the outside, for example, to the sense amplifier. This will be described in more detail later.

A semiconductor device shown in FIGS. 7A and 7B can be fabricated through the aforementioned process.

Referring back to FIGS. 7A and 7B, N (N is a natural number) first active regions 10A are disposed in the mat region, and N second active regions 10B are disposed in the switching region. Although eight first active regions 10A and eight second active regions 10B are illustrated in the present implementation, other implementations are also possible and N may be changed to have various values.

A plurality of the first gates 20A may be formed in the mat region across the first active regions 10A. The first gates 20A may be buried in the substrate 10. A stack structure of the first lower contact 30A, the variable resistance element 32, and the first upper contact 40A may be disposed on the first active region 10A on one side, for example, the first drain of the first gate 20A. The source line contact 42A may be disposed on the first active region 10A on the other side, for example, the first source of the first gate 20A. The first bit line 50A and the first source line 60A extended in the second direction may be disposed on the first upper contact 40A and the source line contact 42A, respectively. Here, the stack structure of the first lower contact 30A, the variable resistance element 32, and the first upper contact 40A may be spaced as far apart as possible from the source line contact 42A in the first direction within the first active region 10A. By doing so, an interval between the first bit line 50A and the first source line 60A can be secured.

Accordingly, a plurality of unit cells can be formed in the mat region, each unit cell including a selection transistor configured to have a gate coupled with the first gate 20A and the variable resistance element 32 coupled with one end of the selection transistor. Both ends of the unit cell may be coupled with a corresponding first bit line 50A and a corresponding first source line 60A.

N second gates 20B, for example, 8 second gates 20B may be disposed in the switching region to cross the second active regions 10B. The second gate 20B may have a similar shape to the first gate 20A and thus, the second gates 20B may be buried in the substrate 10. The second lower contacts 30B may be formed on the substrate 10 on boths side of the second gate 20B across the second active regions 10B to couple the second active regions 10B. On one side of the second gate 20B, one second upper contact 40B is disposed on the second lower contact 30B while overlapping with a corresponding second active region 10B. On the other side of the second gate 20B, N second upper contacts 40B may be disposed on the second lower contact 30B while overlapping with N second active regions 10B, for example, 8 second active regions 10B. On one side of the second gate 20B, the second bit line 50B may be disposed on the second upper contact 40B to extend in the second direction. On the other side of the second gate 20B, the second source line 60B may be disposed on the second upper contact 40B. Accordingly, each second bit line 50B is coupled with a second upper contact 40B, but each second source line 60B is coupled with a plurality of the second upper contacts 40B arranged in the second direction. Here, the second upper contact 40B on one side of the second gate 20B may be spaced as far apart as possible from the second upper contact 40B on the other side of the second gate 20B in the first direction within the second active region 10B. By doing so, an interval between the second bit line 50B and the second source line 60B can be secured.

Accordingly, N switching transistors having respective gates coupled with N second gates 20B are formed in the switching region. Accordingly, a total of N*N switching transistors are disposed in the switching region. As described above, this is because the number of second gates 20B and the number of second active regions 10B may be the same as the number of first bit lines 50A of the mat region, that is, the number of first active regions 10A. In the present implementation, since the gates of the 8 switching transistors are coupled with the respective 8 second gates 20B, a total of 64 switching transistors are disposed in the switching region. Here, the second drains of the 8 switching transistors coupled with one second gate 20B are coupled through the second lower contact 30B on the left side of the second gate 20B and are coupled with a corresponding second bit line 50B through the second upper contact 40B. The second sources of the 8 switching transistors coupled with one second gate 20B are coupled through the second lower contact 30B on the right side of the second gate 20B and are coupled with the 8 second source lines 60B through the second upper contact 40B. Such a switching region is described in more detail below with reference to FIGS. 9A and 9B.

FIG. 9A is a diagram including the equivalent circuit of the switching region of FIG. 7A, and FIG. 9B is a diagram showing a data flow in FIG. 9A.

Referring to FIG. 9A, 8 bit lines BL0 to BL7, 8 source lines SL0 to SL7 corresponding to the respective 8 bit lines BL0 to BL7, and 8 gate lines GL0 to GL7 corresponding to the respective 8 bit lines BL0 to BL7 are disposed in the switching region LYSW. The bit lines BL0 to BL7 and the source lines SL0 to SL7 may be extended in a second direction, and the gate lines GL0 to GL7 may be extended in a first direction.

In the multiple columns of switching transistors at different column positions along the second direction with each column including switching transistors SW0 to SW7 in the first direction, gates of 8 switching transistors SW0 to SW7 arranged in the first direction in a particular column are coupled with a respective gate line of the gate lines GL0 to GL7. The drain nodes of the 8 switching transistors SW0 to SW7 may be coupled from one another, and the source nodes thereof may be coupled from one another. Furthermore, the drain nodes of the switching transistors SW0 to SW7 coupled with any one of the gate lines GL0 to GL7 may be coupled with the respective bit lines BL0 to BL7. For example, the drain node of the switching transistor SW0 coupled with the first gate line GL0 may be coupled with the first bit line BL0, and the drain node of the switching transistors SW1 coupled with the second gate line GL1 may be coupled with the second bit line BL1. The source nodes of the switching transistors SW0 to SW7 may be coupled with the respective source lines SL0 to SL7.

8 bit lines BL0 to BL7 may be coupled with the respective bit lines of the mat region (not shown). Furthermore, the 8 source lines SL0 to SL7 may be coupled with a sense amplifier S/A through a global bit line GBL.

FIG. 9B illustrates an example of how data loaded onto a bit line of the mat region in such a switching region LYSW is transferred to the sense amplifier S/A. In particular, for example, a path along which data transferred through the first bit line BL0. moves (see an arrow of FIG. 9B) is described.

Referring to FIG. 9B with respect to the first row of switching transistors SW0 to SW7 coupled to the first gate line GL0 data inputted from a corresponding bit line of the mat region to the first bit line BL0 is transferred to the drain nodes of all the switching transistors SW0 to SW7 coupled with the first gate line GL0 through the drain node of the first switching transistor SW0 coupled with the first gate line GL0 corresponding to the first bit line BL0. This is because the drain nodes of the switching transistors SW0 to SW7 are coupled from one another.

When voltage for turning on the switching transistors SW0 to SW7 is applied to the first gate line GL0, the data of the drain nodes of the switching transistors SW0 to SW7 is transferred to the source nodes of the switching transistors SW0 to SW7 through the respective channels of the switching transistors SW0 to SW7. The data is output through all the source lines SL0 to SL7 because the source nodes of the switching transistors SW0 to SW7 are coupled from one another and further coupled with the respective source lines SL0 to SL7. The output data can be transferred to the sense amplifier S/A through the global bit line GBL.

In summary, the data inputted to the first bit line BL0 is transferred to the sense amplifier S/A through the plurality of switching transistors SW0 to SW7 coupled with the first gate GL0. Since the switching transistors SW0 to SW7 are coupled in parallel, resistance of the switching transistors SW0 to SW7 is greatly reduced.

Likewise, the data inputted to the remaining bit lines BL1 to BL7 is transferred to the sense amplifier S/A through the plurality of switching transistors SW0 to SW7 coupled with corresponding gates GL1 to GL7.

The semiconductor device and the method of fabricating the same described above have the following advantages.

First, since a unit cell of the mat region and a switching transistor of the switching region can be formed together, any additional process is not necessary, thereby simplifying the process and reducing a process cost.

Furthermore, since the selection transistor of the mat region has substantially the same structure as the switching transistor of the switching region, a well formed within the substrate 10 can be shared between the mat region and the switching region. In other words, the mat region and the switching region can be provided in the same well. Thus, as compared with a case where the mat region and the switching region are provided in different wells as known in the art, an area required for the device can be reduced. Furthermore, if a plurality of the mat regions and a plurality of the switching regions are repeatedly arranged in the second direction as in FIG. 2, all those mat regions and switching regions can be included in the same well (refer to B of FIG. 2).

Furthermore, since the switching transistor has a so-called pin-shaped structure in which the active region further protrudes than the isolation layer in the first direction, similarly to a selection transistor, the switching transistor has low resistance and the current driving ability increases. Furthermore, since a plurality of the switching transistors are coupled in parallel, resistance of the switching transistor can be further reduced.

In the above implementation, the second lower contact 30B has a long bar shape in the first direction which allows the second lower contact 30B to come in contact with all the second active regions 10B arranged in the first direction. However, other implementations are also possible as long as the second lower contact 30B couples all the second active regions 10B arranged in the first direction. One example of such modification will be discussed below with reference to FIGS. 10A and 10B.

Figure 10A:
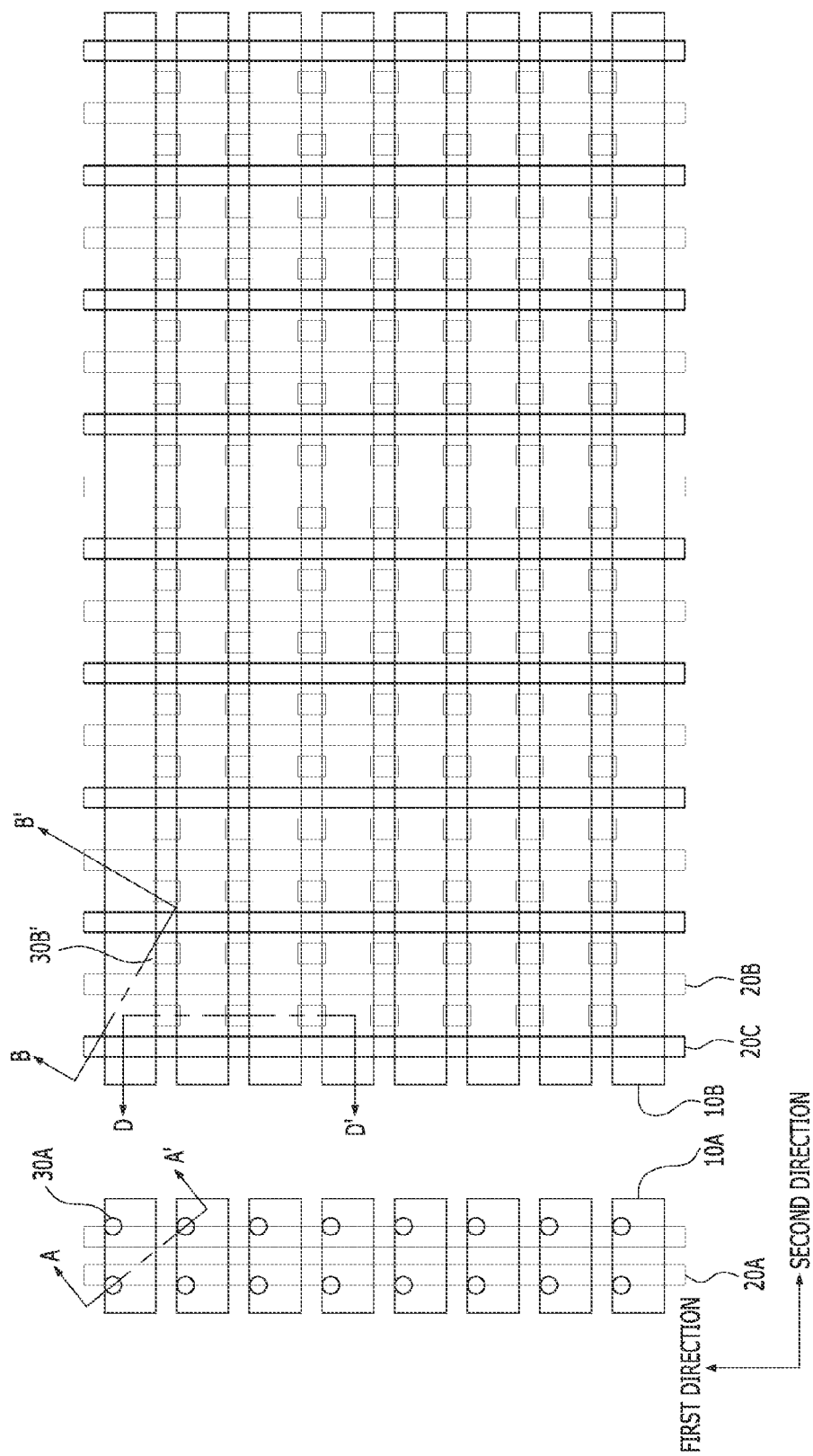
FIG. 10A is a plan view showing the switching region in accordance with another implementation of the disclosed technology in this document.
Figure 10B:
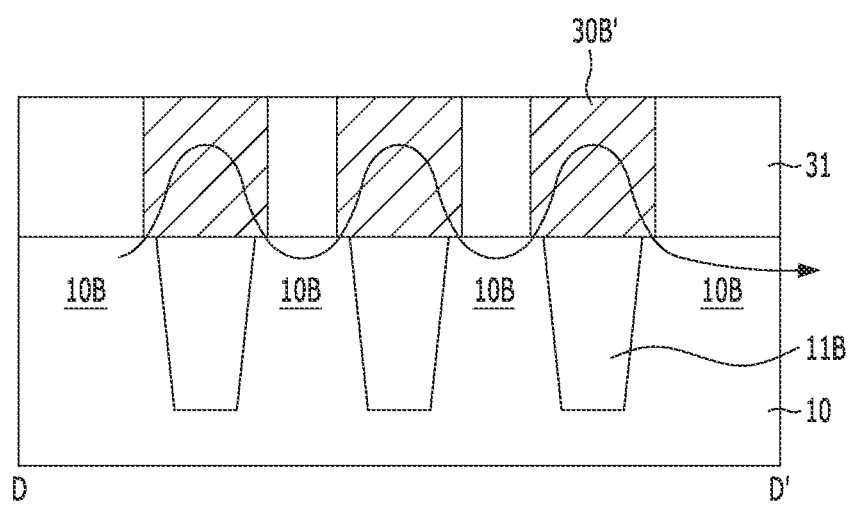
FIG. 10B is a cross-sectional view of the semiconductor device of line D-D' of FIG. 10A.

FIG. 10A is a plan view showing the switching transistor of a semiconductor device, and FIG. 10B is a cross-sectional view along the line D-D' of FIG. 10A. A detailed description will be omitted for the parts that are substantially the same as those of the aforementioned implementation.

Referring to FIGS. 10A and 10B, a plurality of second lower contacts 30B' is disposed on both sides of the second gate 20B. Each second lower contact 30B' is configured to cover a space between two adjacent second active regions 10B in a first direction and overlaps with parts of the two second active regions 10A. Thus, all the second active regions 10B arranged in the first direction may be coupled through the plurality of second lower contact 30B' (see an arrow of FIG. 10B).

Other elements than the second lower contacts 30B' are substantially the same as those of the aforementioned implementations. However, as the second lower contact 30B' is formed as described above, the second lower contact 30B' may not be positioned under the second upper contact 40B to be formed in a subsequent process. For example, on the left side of the second gate 20B, since the second upper contact 40B is on the upper side, the second lower contact 30B' may not be present under the second upper contact 40B. In such a case, the second upper contact 40B may be directly coupled with the second active region 10B instead of being coupled with the second lower contact 30B'.

Although in the implementations of FIGS. 3A to 10B, all the bit lines disposed in the mat region, for example, 8 bit lines, have been illustrated as being coupled with one sense amplifier, the number of sense amplifier connected to the bit lines can be changed. For example, the bit lines disposed in the mat region may be classified into several groups, each group coupled with different sense amplifiers. Such an example will be discussed below with reference to FIGS. 11A and 11B.

Figure 11A:
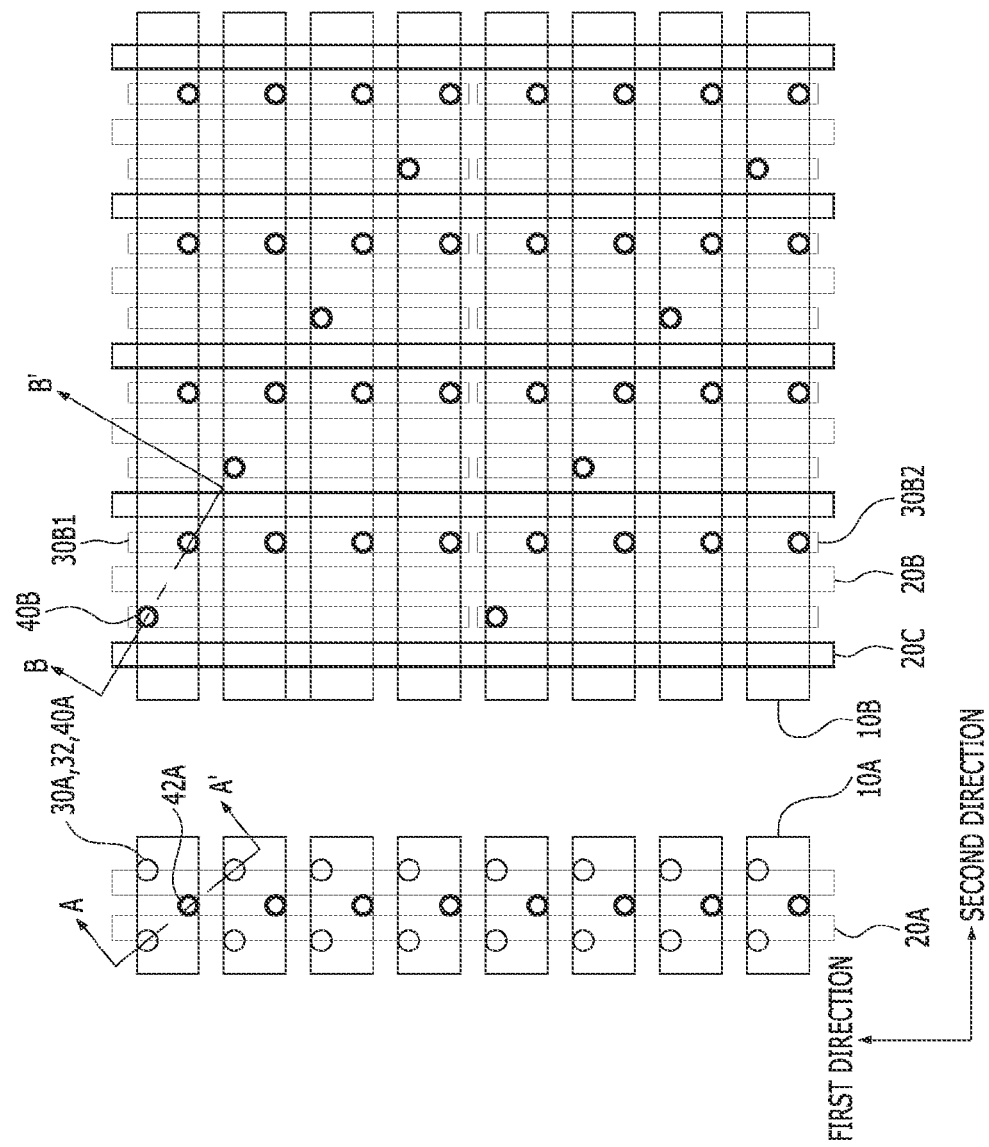
FIG. 11A is a plan view showing the switching region in accordance with yet another implementation of the disclosed technology in this document.
Figure 11B:
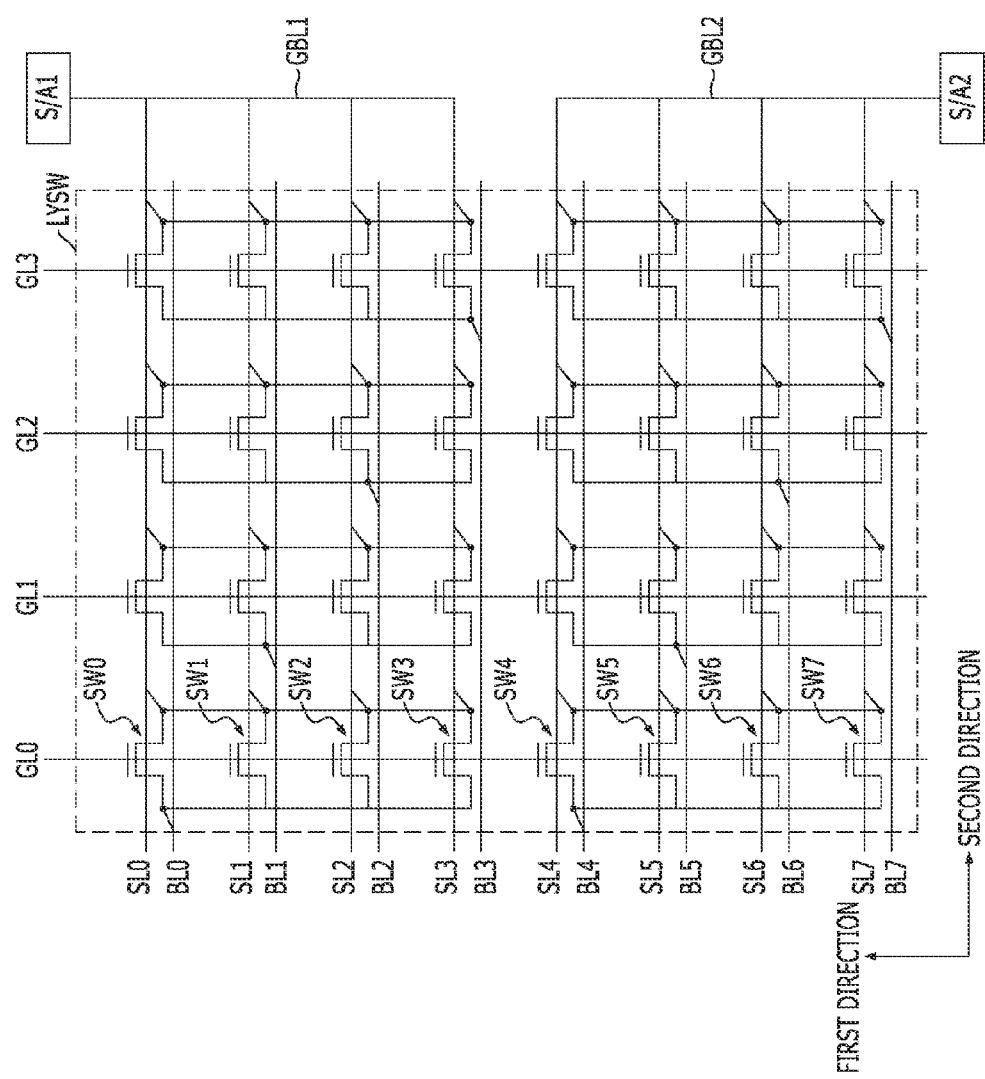
FIG. 11B is a diagram showing the equivalent circuit of a switching region of FIG. 11A.

FIG. 11A is a plan view showing the switching transistor of a semiconductor device, and FIG. 11B is a diagram showing the equivalent circuit of a switching region of FIG. 11A. In the present implementation, 8 bit lines in a mat region are divided into two groups including an upper and a lower groups, each including 4 bit lines. A detailed description will be omitted for the parts that are substantially the same as those of the aforementioned implementations.

Referring to FIG. 11A, a second lower contact 30B1 and a second lower contact 30B2 are disposed on each side of the second gate 20B. The second lower contact 30B1 is disposed on the upper side to couple 4 upper second active regions 10B arranged in the first direction, and the second lower contact 30B2 is disposed on the lower side to couple 4 lower second active regions 10B. That is, the total number of second lower contacts including second lower contacts 30B1 and 30B2 is doubled because the bit lines of the mat region are divided into two groups. Meanwhile, the number of second gates 20B is reduced to ½.

The second upper contact 40B may be disposed on one side, for example, the left of the second gate 20B. On one side of the second gate 20B, the second upper contact 40B overlap with one second active region 10B among the 4 second active regions 10B located on the upper side and coupled by the second lower contact 30B1 and overlaps with one second active region 10B among the 4 second active regions 10B located on the lower side and coupled by the second lower contact 30B2. Meanwhile, the second upper contact 40B may be also disposed on the other side, for example, the right of the second gate 20B. On the other side of the second gate 20B, the second upper contact overlaps with the second active regions 10B arranged in the first direction. As a result, the relative positions of the second upper contacts 40B and the second active regions 10B are symmetric between the upper side and the lower side.

Referring to FIG. 11B, 8 bit lines BL0 to BL7 and source lines SL0 to SL7 respectively corresponding to the 8 bit lines BL0 to BL7 are disposed in a switching region LYSW. The 8 bit lines BL0 to BL7 and the 8 source lines SL0 to SL7 can be divided into a first group and second group on the basis of a sense amplifier. The first group is associated with a first sense amplifier S/A1 and includes the 4 bit lines BL0 to BL3 and the 4 source lines SL0 to SL3. The second group is associated with a second sense amplifier S/A2 and includes the 4 bit lines BL4 to BL7 and the 4 source lines SL0 to SL3. Furthermore, 4 gate lines GL0 to GL3 are disposed to correspond to the 4 bit lines BL0 to BL3 of the first group or the 4 bit lines BL4 to BL7 of the second group. The bit lines BL0 to BL7 and the source lines SL0 to SL7 may extended in a first direction, and the gate lines GL0 to GL3 may be extended in a second direction.

In the multiple columns of switching transistors at different column positions along the second direction with each column including switching transistors SW0 to SW7 in the first direction, the gates of 8 switching transistors SW0 to SW7 of a particular column are coupled with a respective gate line of the gate lines GL0 to GL3. Furthermore, the drain nodes of the 4 switching transistors SW0 to SW3 in the first group may be coupled from one another, and the source nodes thereof may be coupled from one another. Furthermore, the drain nodes of the 4 switching transistors SW4 to SW7 in the second group may be coupled from one another, and the source nodes thereof may be coupled from one another. The drain or source nodes of the switching transistors SW0 to SW3 in the first group are separated from the drain or source nodes of the switching transistors SW4 to SW7 in the second group.

Furthermore, the drain nodes of the switching transistors SW0 to SW3 of the first group in the different columns along the second direction are coupled with the gate lines GL0 to GL3, respectively, and may be coupled with the respective bit lines BL0 to BL3 of the first group. For example, the drain nodes of the switching transistors SW0 to SW3 of the first group in the column coupled with the first gate line GL0 may be coupled with the first bit line BL0 of the first group, and the drain nodes of the switching transistors SW0 to SW3 of the first group in the column coupled with the second gate line GL1 may be coupled with the second bit line BL1 of the first group. The source nodes of the switching transistors SW0 to SW3 of the first group may be coupled with the respective source lines SL0 to SL3 of the first group.

Furthermore, the drain nodes of the switching transistors SW4 to SW7 of the second group in the different columns along the second direction are coupled with the gate lines GL0 to GL3, respectively and, may be coupled with the respective bit lines BL4 to BL7 of the second group. For example, the drain nodes of the switching transistors SW4 to SW7 of the second group in the column coupled with the first gate line GL0 may be coupled with the first bit line BL4 of the second group, and the drain nodes of the switching transistors SW4 to SW7 of the second group in the column coupled with the second gate line GL1 may be coupled with the second bit line BL5 of the second group. The source nodes of the switching transistors SW4 to SW7 of the second group may be coupled with the respective source lines SL4 to SL7 of the second group.

The bit lines BL0 to BL7 may be coupled with the respective bit lines of a mat region (not shown in this drawing). Furthermore, the source lines SL0 to SL3 of the first group may be coupled with a first sense amplifier S/A1 through a first global bit line GBL1, and the source lines SL4 to SL7 of the second group may be coupled with a second sense amplifier S/A2 through a second global bit line GBL2.

In the present implementation, the bit lines of the mat region are divided into the two groups to transfer data to the two sense amplifiers. However, other implementations are also possible. For example, the bit lines disposed in the mat region may be divided into $2^n$ (n is a natural number equal to or greater than 1) groups, each group transferring data to any one of $2^n$ sense amplifiers. In such a case, the second lower contact may be disposed to couple $N/2^n$ active regions among N active regions arranged in the first direction. The number of second gates can be reduced to $N/2^n$.

In the aforementioned implementations, the second gate and the third gate 20C are alternately disposed. However, other implementations are also possible. For example, as shown in FIGS. 12A and 12B, the third gate 20C and two second gates 20B may be repeatedly disposed.

FIG. 12A is a plan view showing the switching transistor of a semiconductor device, and FIG. 12B is a diagram showing the equivalent circuit of a switching region of FIG. 12A. A detailed description will be omitted for the parts that are substantially the same as those of the aforementioned implementations.

In FIG. 12A, a third gate 20C and two second gates 20B are repeatedly disposed. A junction between two sets of two second gates 20B may be shared. In this case, as compared with the implementations of FIGS. 3A to 9B, the number of third gates 20C is reduced almost by half, and the number of second lower contacts 30B is reduced to ¾. Thus, in accordance with the present implementation, an area of the device can be greatly reduced.

Referring to FIG. 12B, in accordance with the configuration of the switching region LYSW as shown in FIG. 12A, the gate lines GL0 to GL7 of a switching region LYSW are classified into a first pair of gate lines GL0 and GL1, a second pair of gate lines GL2 and GL3, a third pair of gate lines GL4 and GL5, and a fourth pair of gate lines GL6 and GL7. The 8 switching transistors SW0 to SW7 are coupled with the first pair of gate lines GL0 and GL1 and share their source nodes.

The data flow will be described below. The flow of data inputted to the first bit line BL0 is substantially the same as that described with reference to FIG. 9B. However, the flow of data inputted to the second bit line BL1 is partially detoured as indicated by an arrow. This is because the switching transistors SW0 to SW7 which coupled with the second gate line GL1 corresponding to the second bit line BL1 have the drain nodes placed on the right side and the source nodes placed on the left side. As already discussed above, data inputted to one bit line is outputted to a global bit line GBL through the plurality of switching transistors SW0 to SW7 and the plurality of source lines SL0 to SL7.

In the above implementations, the switching transistor of the switching region couples with the first bit line 50A of the mat region and transfers the signal of the first bit line 50A to the sense amplifier S/A. However, other implementations are also possible. For example, the switching transistor of the switching region may be coupled with the first source line 60A of the mat region and configured to control coupling between the first source line 60A and an external wire. Such an example will be illustrated below with reference to FIGS. 13A and 13B.

Figure 13B:
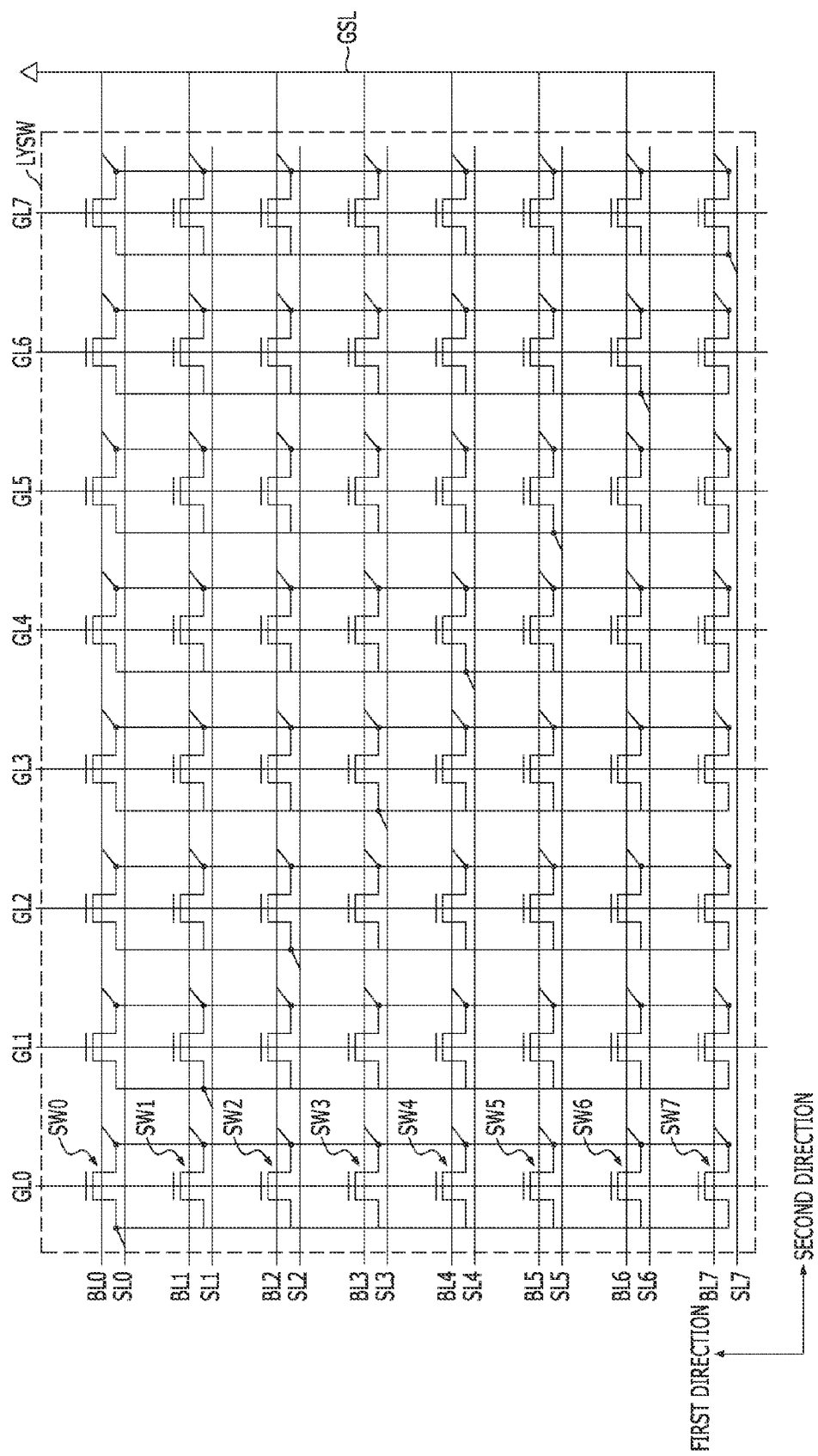
FIG. 13B is a diagram showing the equivalent circuit of a switching region of FIG. 13A.

FIG. 13A is a plan view showing the switching transistor of a semiconductor device, and FIG. 13B is a diagram showing the equivalent circuit of a switching region of FIG. 13A. A detailed description will be omitted for the parts that are substantially the same as those of the aforementioned implementations.

Referring to FIG. 13A, the first source lines 60A of the mat region are coupled with the corresponding first source lines 60B of the switching region, and the first bit lines 50A are separated from the second bit lines 50B.

A second upper contact 40B is coupled with each second source line 60B, but a plurality of the second upper contacts are coupled with each bit line 50B. In each bit line 50B, a plurality of the second upper contacts 40B are arranged in a second direction. Accordingly, when 8 switching transistors are coupled with a second gate 20B, their second sources are coupled through the second lower contact 30B on the left side of the second gate 20B. In this case, 8 switching transistors are coupled with one corresponding second source line 60B through the second upper contact 40B. Meanwhile, when 8 switching transistors are coupled with a second gate 20B, their second drains are coupled through the second lower contact 30B on the right side of the second gate 20B. In this case, 8 switching transistors are coupled with the 8 second bit lines 50B through the second upper contact 40B.

Referring to FIG. 13B, the source nodes of the switching transistors SW0 to SW7 coupled with any one of the gate lines GL0 to GL7 may be coupled with a corresponding one of the source lines SL0 to SL7. For example, the source nodes of the switching transistors SW0 to SW7 coupled with the first gate line GL0 may be coupled with the first source line SL0, and the source nodes of the switching transistors SW0 to SW7 coupled with the second gate line GL1 may be coupled with the second source line SL1. The drain nodes of the switching transistors SW0 to SW7 may be coupled with the respective bit lines BL0 to BL7.

The 8 source lines SL0 to SL7 may be coupled with the respective source lines (not shown in this drawing) of a mat region. Furthermore, the 8 bit lines BL0 to BL7 may be coupled by external wires through a global source line GSL. Detailed explanations will be omitted since a signal is transferred between the source lines SL0 to SL7 and the external wires in the substantially same manner as that described above.

In accordance with the electronic device of the disclosed technology in this patent document, an area for an electronic device can be reduced. Further, as the resistance of the switching transistor decreases, device characteristics can be improved. Further, the process for fabricating an electronic device can be simplified, and a cost for fabricating an electronic device can be reduced.

The above and other memory circuits or semiconductor devices based on the disclosed technology can be used in a range of devices or systems. FIGS. 14-18 provide some examples of devices or systems that can implement the memory circuits disclosed herein.

Figure 14:
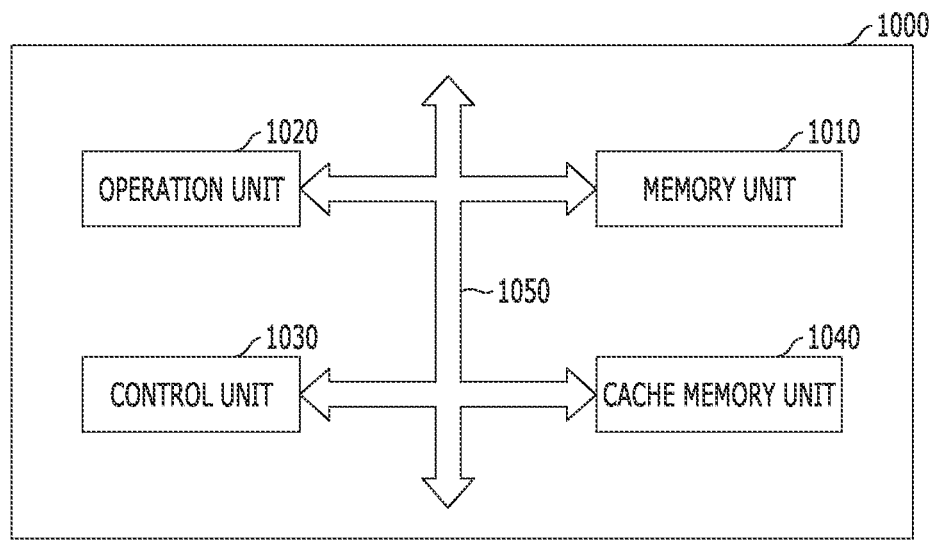
FIG. 14 is an example of configuration diagram of a microprocessor implementing memory circuitry based on the disclosed technology.

FIG. 14 is an example of configuration diagram of a microprocessor implementing memory circuitry based on the disclosed technology.

Referring to FIG. 14, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the memory unit 1010 and the microprocessor 1000 can be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 15:
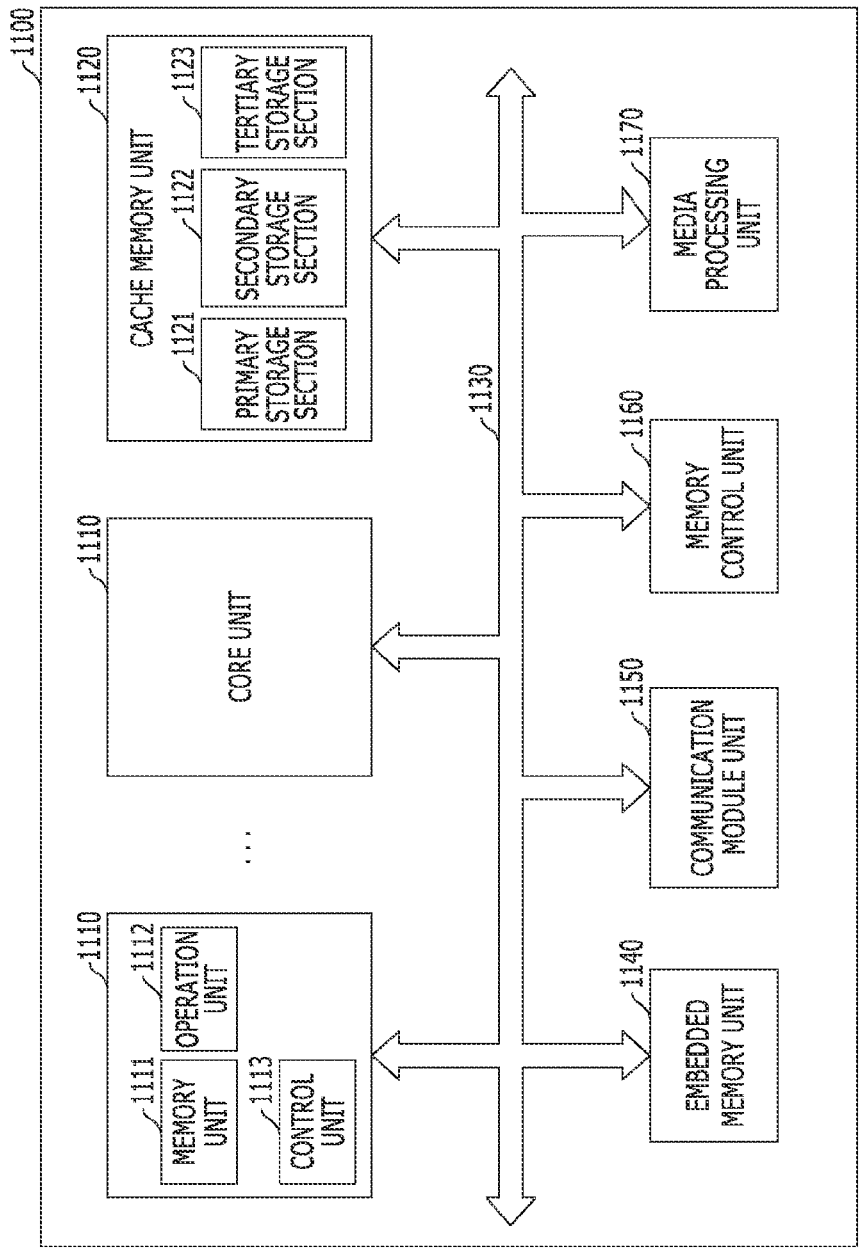
FIG. 15 is an example of configuration diagram of a processor implementing memory circuitry based on the disclosed technology.

FIG. 15 is an example of configuration diagram of a processor implementing memory circuitry based on the disclosed technology.

Referring to FIG. 15, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the cache memory unit 1120 and the processor 1100 can be improved.

Although it was shown in FIG. 15 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 16:
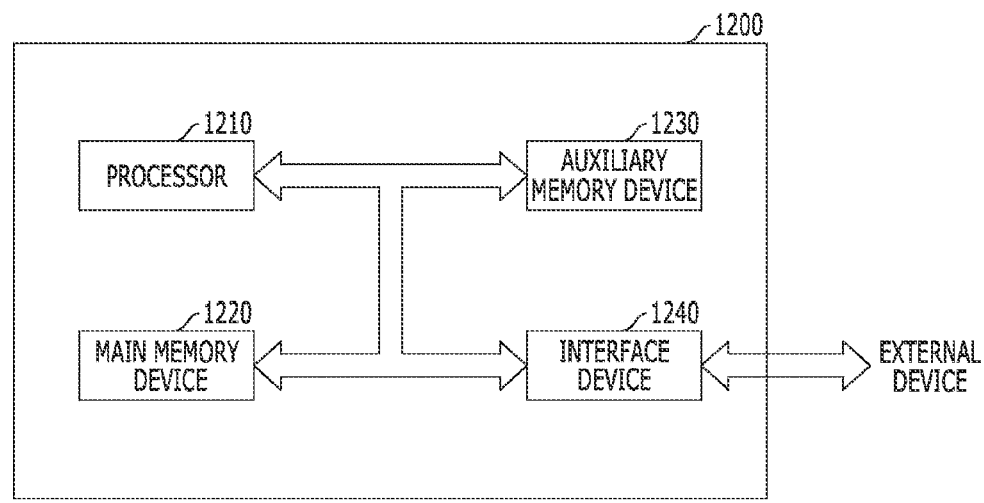
FIG. 16 is an example of configuration diagram of a system implementing memory circuitry based on the disclosed technology.

FIG. 16 is an example of configuration diagram of a system implementing memory circuitry based on the disclosed technology.

Referring to FIG. 16, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified, and improving device characteristics of the main memory device 1220 and the system 1200 may be possible.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the auxiliary memory device 1230 and the system 1200 can be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 17:
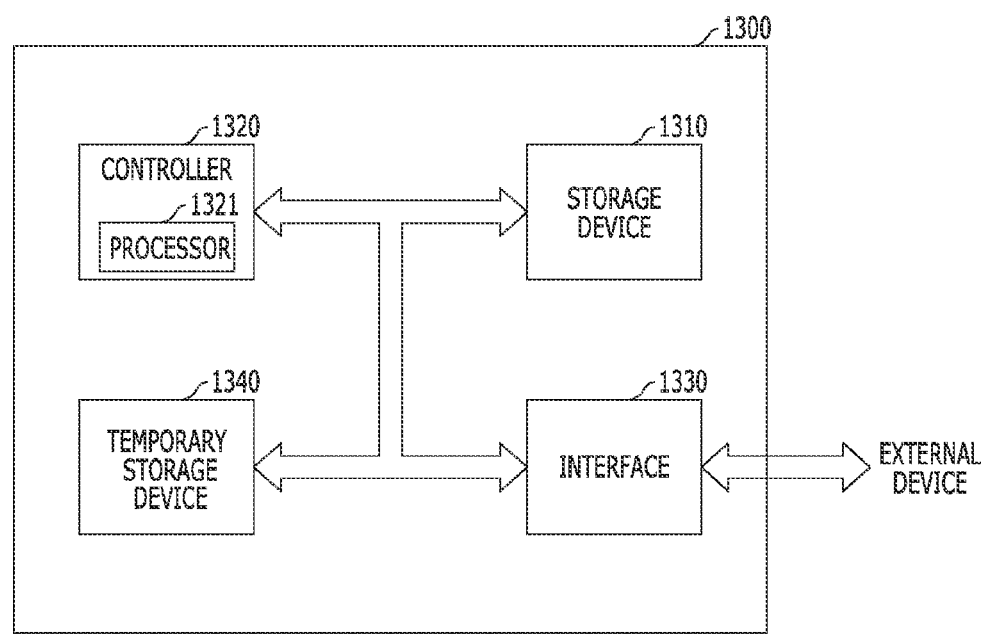
FIG. 17 is an example of configuration diagram of a data storage system implementing memory circuitry based on the disclosed technology.

FIG. 17 is an example of configuration diagram of a data storage system implementing memory circuitry based on the disclosed technology.

Referring to FIG. 17, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the temporary storage device 1340 and the data storage system 1300 can be improved.

Figure 18:
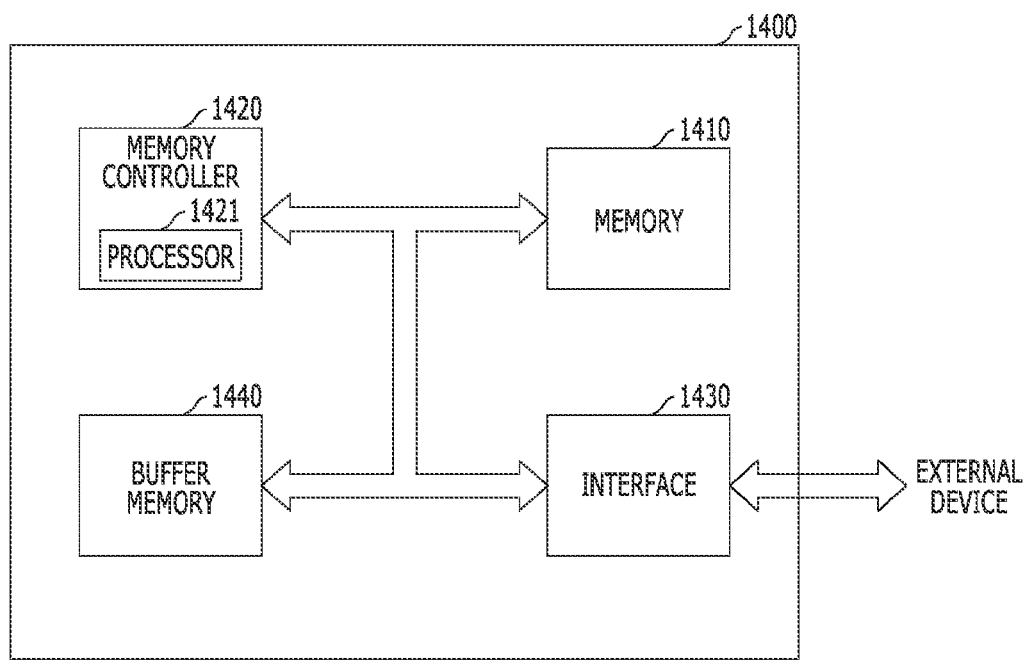
FIG. 18 is an example of configuration diagram of a memory system implementing memory circuitry based on the disclosed technology.

FIG. 18 is an example of configuration diagram of a memory system implementing memory circuitry based on the disclosed technology.

Referring to FIG. 18, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the memory 1410 and the memory system 1400 can be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a mat region configured to include a plurality of memory cells coupled with first wires; and a switching region configured to control coupling between the first wires and an external region in transfer of data stored in the memory cells, wherein the switching region includes: a substrate configured to include second active regions arranged in a first direction and extended in a second direction crossing the first direction; second gates extended in the first direction across the second active regions; second lower contacts disposed over the substrate on both sides of each second gate, each second lower contact configured to couple the second active regions arranged in the first direction; second upper contacts disposed over the second lower contacts, each second upper contact overlapping with a corresponding second active region on a first side of each second gate and overlapping with every second active regions on a second side of each second gate; second wires coupled with the second upper contacts on the first side of each second gate and the first wires and extended in the second direction; and third wires coupled with the second upper contacts on the second side of each second gate and an external region and extended in the second direction. Through this, an area for an electronic device can be reduced and the fabrication process can be easier and more simplified. Further, device characteristics of the buffer memory 1440 and the memory system 1400 can be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 14-18 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, the semiconductor memory including:
   a mat region configured to include a plurality of memory cells coupled with first wires; and
   a switching region configured to control coupling between the first wires and an external region in transfer of data stored in the memory cells,
   wherein the mat region comprises:
   first active regions formed in a substrate, extended in a second direction, and arranged in a first direction crossing the second direction;
   a first gate extended in the first direction across the first active regions;
   stack structures respectively disposed over the first active regions on a first side of the first gate, each stack structure including a first lower contact, a variable resistance element, and a first upper contact; and
   wire contacts disposed over every first active regions on a second side of the first gate, and
   fourth wires, wherein the first wires are coupled with one of the stack structures and the wire contacts and extended in the second direction, and the fourth wires coupled with the other of the stack structures and the wire contacts and extended in the second direction.

2. The electronic device of claim 1, wherein the switching region includes:
   second active regions formed in the substrate, arranged in the first direction and extended in the second direction;
   second gates extended in the first direction across the second active regions;
   second lower contacts disposed over the substrate on both sides of each second gate, each second lower contact configured to couple the second active regions arranged in the first direction;
   second upper contacts disposed over the second lower contacts, each second upper contact overlapping with a corresponding second active region on a first side of each second gate and overlapping with every second active regions on a second side of each second gate;

second wires coupled with the second upper contacts on the first side of each second gate and the first wires and extended in the second direction; and third wires coupled with the second upper contacts on the second side of each second gate and an external region and extended in the second direction.

3. The electronic device of claim 2, wherein the first and the second active regions, the first and the second gates, the first and the second lower contacts, the first to the third upper contacts, and the first to the fourth wires are placed at the same height.

4. The electronic device of claim 2, wherein:

the switching region is disposed on at least one side of the mat region in the second direction, and the electronic device further comprises:

a first driver disposed on at least one side of the mat region in the first direction, and coupled with the first gate to control the first gate; and a second driver placed in a region defined by the switching region and the first driver, and coupled with the second gate to control the second gate.

5. The electronic device of claim 2, wherein a number of the first wires, a number of the second active regions, a number of the second gates, a number of the second wires, a number of the third wires and a number of the first active regions are same.

6. The electronic device of claim 1, wherein the mat region and the switching region share a well formed in the substrate.

7. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

8. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

9. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

10. The electronic device according to claim 1, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

11. An electronic device comprising semiconductor memory, wherein the semiconductor memory includes:

a mat region configured to comprise a plurality of memory cells and first wires coupled with the plurality of memory cells; and a switching region configured to control coupling between the each of the first wires and an external region, wherein the switching region comprises:

second wires coupled with the respective first wires and extended in a second direction;

third wires configured to correspond to the respective second wires, extended in the second direction, and coupled with the external region;

second gate lines configured to correspond to the respective first wires and extended in a first direction crossing the second direction; and switching transistors configured to have gates coupled with each of the second gate lines and arranged in the first direction, wherein first nodes of the switching transistors are coupled together and coupled with a corresponding second wire of the second wires, and second nodes of the switching transistors are coupled with all the N third wires.

12. The electronic device of claim 11, wherein each of the plurality of memory cells comprises a variable resistance element and a selection transistor, and the mat region includes the first wire extended in the first direction and coupled with a first end of the memory cell, a fourth wire extended in the first direction and coupled with a second end of the memory cell, and a first gate line coupled with a gate of the selection transistor and extended in the first direction.

13. The electronic device of claim 12, wherein:

the switching region is disposed on at least one side of the mat region in the second direction, and the electronic device further comprises:

a first driver disposed on at least one side of the mat region in the first direction, coupled with the first gate line, and configured to control the first gate line; and a second driver placed in a region defined by the switching region and the first driver, coupled with the second gate line, and configured to control the second gate line.

14. The electronic device of claim 11, wherein:
the first wires are included in a wire group, the mat region includes wire groups,
the switching region comprises small switching regions configured to correspond to the respective wire groups and arranged in the first direction, and
the second gate line is shared in the small switching regions.

15. The electronic device of claim 14, wherein the number of wire groups of the mat region are coupled with different external regions through the respective small switching region.

16. The electronic device of claim 11, wherein a number of the first wires, a number of the second wires, a number of the third wires, a number of the second gate lines, and a number of the switching transistors coupled to each second gate line are same.

17. The electronic device according to claim 11, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

18. The electronic device according to claim 11, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

19. The electronic device according to claim 11, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

20. The electronic device according to claim 11, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

* * * * *